(12) United States Patent
Ly et al.

(10) Patent No.: US 7,712,062 B2
(45) Date of Patent: *May 4, 2010

(54) METASTABILITY EFFECTS SIMULATION FOR A CIRCUIT DESCRIPTION

(76) Inventors: Tai An Ly, 4001 Prentice La., Austin, TX (US) 78746; Ka Kie Kwok, 928 Cameron Cir., Milpitas, CA (US) 95035; Vijaya Vardhan Gupta, 114 Birch Ridge Cir., San Jose, CA (US) 95123; Lawrence Curtis Widdoes, Jr., 3714 Brigadoon Way, San Jose, CA (US) 95121

( * ) Notice: Subject to any disclaimer, the term of this patent is extended or adjusted under 35 U.S.C. 154(b) by 131 days.

This patent is subject to a terminal disclaimer.

(21) Appl. No.: 12/029,440

(22) Filed: Feb. 11, 2008

(65) Prior Publication Data
US 2008/0134115 A1    Jun. 5, 2008

Related U.S. Application Data

(63) Continuation of application No. 11/140,678, filed on May 27, 2005, now Pat. No. 7,356,789, which is a continuation-in-part of application No. 10/859,055, filed on Jun. 1, 2004, now Pat. No. 7,243,322.

(51) Int. Cl.
*G06F 17/50* (2006.01)
*G06F 9/45* (2006.01)
(52) U.S. Cl. ............................... 716/5; 716/6
(58) Field of Classification Search ...................... 716/5, 716/6
See application file for complete search history.

(56) References Cited

U.S. PATENT DOCUMENTS

| | | | |
|---|---|---|---|
| 4,575,644 A | 3/1986 | Leslie | |
| 5,465,216 A | 11/1995 | Rotem et al. | |
| 6,175,946 B1 | 1/2001 | Ly et al. | |
| 6,192,505 B1 | 2/2001 | Beer et al. | |
| 6,408,265 B1 | 6/2002 | Schulz et al. | |
| 6,580,773 B1 | 6/2003 | Corvasce | |

(Continued)

OTHER PUBLICATIONS

Robert K. Brayton et al.; VIS: A System for Verification and Synthesis; Proceedings on Computer-Aided Verification; Jul. 1996; pp. 1-4.

(Continued)

*Primary Examiner*—Jack Chiang
*Assistant Examiner*—Magid Y Dimyan
(74) *Attorney, Agent, or Firm*—Klarquist Sparkman, LLP

(57) ABSTRACT

A circuit design that contains at least two clock domains is simulated using a novel system and method for injecting the effects of metastability. The system includes detectors for detecting, during simulation, when a clock in a transmit clock domain and a clock in a receive clock domain are aligned and when the input of a register receiving a clock-domain-crossing signal is changing. The system includes coverage monitors for measuring, during simulation, statistics related to metastability injection. The system accurately models the effects of metastability by, at appropriate times during simulation, pseudo-randomly inverting outputs of registers receiving clock-domain-crossing signals. By accurately modeling the effects of metastability, errors in the circuit design can be detected while simulating a pre-existing simulation test. The simulation with metastability effects injection is repeatable and requires no modification of pre-existing RTL design files or simulation test files.

21 Claims, 23 Drawing Sheets

U.S. PATENT DOCUMENTS

| | | | |
|---|---|---|---|
| 6,609,229 | B1 | 8/2003 | Ly et al. |
| 7,089,518 | B2 | 8/2006 | Bair et al. |
| 7,243,322 | B1 | 7/2007 | Ly et al. |
| 7,356,789 | B2 | 4/2008 | Ly et al. |
| 7,454,728 | B2 | 11/2008 | Ly et al. |
| 2004/0221249 | A1 | 11/2004 | Lahner et al. |
| 2005/0069068 | A1 | 3/2005 | Gundurao et al. |
| 2005/0097484 | A1 | 5/2005 | Sarwary et al. |
| 2005/0251779 | A1 | 11/2005 | Chard et al. |
| 2006/0206846 | A1 | 9/2006 | Kowatari |

OTHER PUBLICATIONS

Chris Ka-Kei Kwok et al.; "Using Assertion-Based Verification to Verify Clock Domain Crossing Signals"; Design & Verification Conference (DVCon) Technical Paper; Feb. 2003; DVCon; pp. 1-9.

Tim Behne; "FPGA Clock Schemes"; Embedded Systems Programming; Feb. 10, 2003; URL: http://www.embedded.com/shared/printableArticle.jhtml;jsesessionid...; pp. 1-6.

Michael Crews et al.; "Practical Design for Transferring Signals Between Clock Domains"; www.edn.com; Feb. 20, 2003; pp. 65, 66, 68, 71.

Jens Rennert et al.; "Clock Domain Modeling is Essential in High Desity Soc Design"; EETIMES; Jun. 6, 2003; URL: http://eetimes.com/article/printableArticle.jhtml;jsessionid....; pp. 1-4.

Edmund Clarke et al.; "Bounded Model Checking Using Satisfiability Solving"; published in Formal Methods in System Design; vol. 19, iss. 1; Jul. 2001; Kluwer Academic Publishers; pp. 1-20.

Christoph Keran et al.; "Formal Verification in Hardware Design: A Survey"; in ACM Trans. On Design Automation of Electronic Systems; vol. 4; Apr. 1999; pp. 1-61.

William J. Dally et al.; "Digital Systems Enineering"; Cambridge University Press; 1998; pp. 462-513.

Edmund M. Clarke, Jr. et al.; "Model Checking"; The MIT Press, Cambridge Mass.; 1999; pp. 35-49.

"VIS: A system for Verification and Synthesis"; The VIS Group, in the Proceedings of the 8th International Conference on Computer Aided Verification, pp. 428-432; Springer Lecture Notes in Computer Science, #1102; Edited by R. Alur and T. Henzinger, New Brunswick, NJ, Jul. 1996; pp. 1-2.

J.R. Burch' "Symbolic Model Checking: 1020 States and Beyond"; Information and Computation, vol. 98 No. 2; Jun. 1992; pp. 428-439.

Yatin Hoskote et al. "Coverage Estimation for Symbolic Model Checking"; ACM Inc.1999; pp. 1-6.

Jerry R. Burch et al.; "Automatic Verification of Pipeling Microprocessor Control"; Conference on Computer-Aided Verification Jun. 1994; pp. 1-17.

E.M. Clarke et al.; "Automatic Verification of Finite-State Concurrent Systems Using Temporal Logic Specifications"; ACM Transactions on Programming Languages and Systems; vol. 8, No. 2; Apr. 1986; pp. 224-263.

David L. Dill et al.; "Protocol Verification as a Hardware Design AID"; Stanford University; 1992; pp. 1-4.

Donald E. Thomas et al.; "The Verilog Hardware Discription Language, Fifth Edition"; Verilog of Cadence Design Systems Inc.; 2002; pp. 195-210.

K.L. McMillan; "Symbolic Model Checking—and Approach to the State Explosion Problem"; Carnegie Mellon University 1992; pp. 1-212.

Tai Ly, Neil Hand and Chris Ka-Kei Kwok, "Formally Verifying Clock Domain Crossing Jitter Using Assertion-Based Verification", DVCon, Feb. 2004, 5 pages.

Chris Ka-kei Kwok, Vijay Vardhan Gupta and Tai Ly, ."Using Assertion-Based Verification to Verify Clock Domain Crossing Signals", DVCon, Feb. 2003, 9 pages.

Ran Ginosar, "Fourteen Ways to Fool Your Synchronizer", ASYNC'03), © 2003 IEEE Computer Society, 8 pages.

METASTABILITY EFFECTS SIMULATION FOR A CIRCUIT DESCRIPTION

RELATED APPLICATIONS

This application is a continuation of U.S. Non-Provisional application Ser. No. 11/140,678, filed May 27, 2005 entitled "Metastability Effects Simulation for a Circuit Description" which is a continuation-in-part of U.S. Non-Provisional application Ser. No. 10/859,055, filed Jun. 1, 2004 entitled "Metastability Injector for a Circuit Description" by Ly, et al. now U.S. Pat. No. 7,243,322 B1, the disclosure of which is incorporated herein by reference in its entirety.

BACKGROUND

Circuit designers must verify the performance of newly-designed circuits. To aid the designer, Electronic Design Automation (EDA) tools from companies such as Synopsys, Cadence Design Systems, and Mentor Graphics, the assignee of the present invention, simulate and formally verify circuits described at the register transfer level (RTL) level using languages such as Verilog and VHDL.

One problem that has long confronted circuit designer is the verification of the effects of metastability in a circuit containing signals that cross clock domains. One such circuit where metastability may arise is illustrated in conjunction with FIG. 1A, which shows a prior art circuit 100 containing two portions 101 and 102 and a path 104 that carries a signal from portion 101 to portion 102. Path 104 may pass through any amount of combinational logic 199 (formed of logic elements but no storage elements). Registers in one portion 102 are clocked by a clock signal on a path 105 whereas registers in the other portion 101 are clocked by another clock signal on a different path 106. Note that the two clock signals on the two paths 105 and 106 are different from one another, which makes the two portions 101 and 102 into two different clock domains, hereinafter referred to as transmit clock domain 101 and receive clock domain 102. The difference in clock signals on paths 105 and 106 can be a difference in only frequency or only phase or both. For example, the clock signals on path 105 and 106 may have the respective frequencies 50 MHz and 37 MHz. A signal on path 104 crosses from clock domain 101 to clock domain 102, and hence this signal (on path 104) is hereinafter called a clock-domain-crossing ("CDC") signal.

Although circuit 100 is illustrative of one clock-domain-crossing signal it is well known to the skilled artisan that today's integrated circuits have 100s of 1000s of such clock-domain-crossing signals and have 100s of clock domains. Moreover, the clock-domain-crossing signal on path 104 may pass through any amount of combinational logic 109 when traveling from transmit domain 101 to receive domain 102. Combinational logic 109 typically consists of any number of logic elements that are not clocked (i.e. there are no storage elements therein).

Each of portions 101 and 102 of circuit under verification 100 may contain any number of and any kind of circuit elements, e.g. storage elements that need to be clocked such as flip flops, as well as logic elements such as XOR gates and AND gates. For example, FIG. 1B shows a register 111 in the receive clock domain 102 of the circuit 100 of FIG. 1A. The D input of the register 111 of FIG. 1B is connected to the path 104 of FIG. 1A and therefore receives the clock-domain-crossing signal from domain 101. Moreover, the Q output of the register 111 of FIG. 1B generates a signal RX_Q that may be provided to any additional circuitry 191 in receive clock domain 102.

FIG. 1C shows another register 112 that is located in the transmit clock domain 101 of the circuit 100 of FIG. 1A. Register 112 has a Q output which drives the clock-domain-crossing signal on path 104. The D input of the register 112 of FIG. 1C receives a signal TX_D from any additional circuitry 192 in the transmit clock domain 101. The above-described additional circuitry 191 and 192 are each normally clocked by their respective clock signals on paths 105 and 106 respectively (and for this reason they belong to their respective clock domains).

It is well known in the art to verify the functional behavior of circuit 100 (which is also referred to as "circuit-under-verification"), based on a circuit description, by use of conventional register-transfer-level (hereinafter, RTL) simulators such as VCS (from Synopsys, Inc.) and Verilog NC (from Cadence Design Systems, Inc.). The circuit description for circuit 100 is normally articulated by a circuit designer in a Hardware Description Language (HDL), such as Verilog. Note that instead of a Verilog representation, circuit 100 may be described in any other HDL, such as VHDL, or in an internal representation (such as a graph structure or a net list structure) in a programmed computer as will be apparent to the skilled artisan.

A designer of circuit 100 may additionally articulate a description of one or more assertions that monitor various signals in circuit 100 that normally occur during simulation. The assertions (also called "checkers") are articulated to generate error signals when a certain combination of signals in circuit 100 cause a condition specified in the assertion to be violated during simulation. Assertions can receive signals from either or both portions 101 and 102 of circuit 100, depending on the assertion.

FIG. 1A illustrates an assertion 103 that receives input signals on paths 108 and 107 respectively from each of the two clock domains 101 and 102. Note that paths 107 and 108 are shown dashed in FIG. 1A to indicate that the paths are not necessarily present in a circuit description, e.g. assertion 103 may receive signals only on path 108 or only on path 107 or on both paths 107 and 108 depending on the circuit design and/or the assertion. For more information on assertions, see U.S. Pat. Nos. 6,175,946 and 6,609,229 granted to Ly et al that are incorporated by reference herein in their entirety.

During simulation of circuit 100 (FIG. 1A) with conventional RTL simulators, assertion 103 does not receive certain signals that result from the effects of metastability, because metastability is not modeled explicitly in prior art systems. In contrast, metastability effects are known to arise in physical implementations of circuit 100, due to the difference in the two clock signals on paths 105 and 106. Specifically, a physical register implemented in silicon, for example, the register in FIG. 1B that receives the clock-domain-crossing signal of FIG. 1A, is characterized by parameters called "setup time" and "hold time". If a signal at the data input of the physical register changes logic values within the setup time before the active edge of the register's clock signal, or within the hold time after the active edge of the register's clock signal, then the output of the register becomes unpredictable, and may settle to either logic value 1 or logic value 0. For more information, see "Digital Systems Engineering," Dally, W. J., and Poulton, J. W., Cambridge Univerity Press, 1998, pp. 462-513.

A clock-domain-crossing signal on path 104 changes its logic value during the setup time or during the hold time of register 111 in the receive clock domain 102 due to the relative difference in times at which the two clock domains 101 and 102 are clocked by their respective clock signals on paths 106 and 105. FIGS. 2A and 2B show representative electrical waveforms for the output of a physical register in the physical world that has been implemented in silicon (as an integrated circuit die), in situations where the clock-domain-crossing signal violates the setup time of this register 111.

In FIG. 2A, a signal at the output of register 111 initially goes only part way to logic level 1 and then settles to logic level 0 whereas in FIG. 2B the same signal initially goes only part way to logic level 1 and then settles to logic level 1. Similarly, FIGS. 2C and 2D show the corresponding electrical waveforms when the hold time of the physical register 111 is violated and the output signal settles to logic level 1 and logic level 0 respectively. The logic level to which a signal settles in the physical world i at the output of a physical register 111 depends on a number of factors (such as thermal effects and/or voltages) that are not normally modeled in conventional RTL simulation.

FIGS. 3A and 3B show representative simulation waveforms produced by conventional RTL simulation of the circuit 100 of FIG. 1A in cases where a signal at the data input of a register 111 in the receive clock domain 102 violates the setup time and hold time parameters. As can be seen by comparing FIG. 3A with FIGS. 2A and 2B and by comparing FIG. 3B with FIGS. 2C and 2D, the electrical waveforms of the physical register may differ from the simulation waveforms produced by conventional RTL simulation when the setup or hold time parameter of the register is violated. Note that only one outcome is produced by the RTL simulator when the setup time is violated as shown in FIG. 3A. Similarly only one outcome is produced when the hold time is violated as shown in FIG. 3B. The outcome produced by the RTL simulator is also called the "correct" logic value, and the inversion of the outcome produced by the RTL simulator is also called the "incorrect" logic value.

In contrast, when a signal at the data input of a physical register in the physical world changes logic values within the setup time before the active edge of the register's clock signal, then the signal at the output of the physical register in the physical world may settle to either a "correct" logic value (i.e., a value matching the value produced by conventional RTL simulation of the register), or an "incorrect" logic value (i.e., the inversion of the value produced by conventional RTL simulation of the register), as shown in FIGS. 2A and 2B. Similarly, two outcomes are possible when the signal changes within the hold time after the active edge of the register's clock signal, as shown in FIGS. 2C and 2D.

An example circuit 400 shown in FIG. 4A is similar or identical to the corresponding circuit 100 described above, except for the following differences. The reference numerals in FIG. 4A are obtained from the corresponding reference numerals in FIG. 1A by adding 300. Circuit 400 includes multiple paths (e.g. n paths) in a bus 404 between the two clock domains 401 and 402. In this example, the n-bit signal on bus 404 that crosses clock domains 401 and 402 happens to have been designed by the circuit designer to be one-hot, which satisfies the property that exactly one bit of the n-bit signal is asserted at all times during normal operation.

Note that in circuit 400 of FIG. 4A, assertion 403 is coupled to only the receive clock domain 402 to receive therefrom a version of the n-bit signal after it has been clocked in by receive clock domain 402 (which receives this signal on path 404 from transmit clock domain 401). Assertion 403 may be articulated by the designer of circuit 400 to be a one-hot assertion which checks that the signal on path 407 is in fact one hot (i.e. that exactly one bit of the n-bit signal is asserted at all times). Assertion 403 contains an XNOR gate 421 that receives signals RX_Q_1 and RX_Q_0 that are output by registers 411_1 and 411_0. XNOR gate 421 supplies an error signal when its inputs are the same and this error signal is latched in a register 422 also included in assertion 403. Note that assertion 403 is not connected to transmit clock domain 401 in this example although in other examples such an assertion may be connected to only transmit clock domain 401, or to both clock domains.

An example of circuit 400, for n=2, is described next, in reference to FIG. 4B. Transmit clock domain 401 contains two registers that form a one-hot counter 412 (see registers 412_1 and 412_0, together called "tx_reg"). Counter 412 is clocked by the rising edge of the transmit clock signal TX_CLK. When the reset signal RST, is asserted, register 412_1 is set to 0 (deasserted) and register 412_0 is set to 1 (asserted). At each rising edge of the transmit clock signal TX_CLK after the reset signal RST is deasserted, the values stored in registers 412_1 and 412_0 are swapped. Therefore, the counter 412 (called "tx_reg" which is a short form for "transmitting register") remains one-hot at all times after reset.

In the example circuit of FIGS. 4B and 4C, the one hot signal from tx_reg counter 412 (i.e. from registers 412_1 and 412_0) is clocked into a counter 411 (formed by registers 411_1 and 411_0 that are together called "rx_reg" which is a short form for "receiving register"), on each rising edge of receive clock signal RX_CLK. As described above, since input signal TX_Q_0 is clocked into receiving register 411_0 by a first clock signal (RX_CLK), transmitting register 412_0 is in the combinational fanin of signal TX_Q_0, and register 412_0 is clocked by a second clock signal (TX_CLK), it follows that signal TX_Q_0 is a clock-domain-crossing ("CDC") signal. Note that signal TX_Q_0 transmitted by the transmit clock domain 401 on path 404_0 is same as signal RX_D_0 that is received by the receive clock domain 402 at the D input of register 411_0. In a similar manner, note that signal TX_Q_1 is a CDC signal also, and is same as signal RX_D_1 received at the D in put of register 411_1.

A Verilog representation of circuit 400 of FIG. 4B is shown in Appendix A, which is located just before the claims in this patent application. Appendix A is an integral portion of this background section of this patent application, and is incorporated by reference herein in its entirety. For a description of the Verilog language, see "The Verilog Hardware Description Language, Second Edition" Thomas, D. E., and Moorby, P. R., Kluwer Academic Publishers, 1995. In the Verilog of FIG. 4B, registers 411_1, 411_0, 412_1 and 412_0 are represented as rx_reg_1, rx_reg_0, tx_reg_1, and tx_reg_0 respectively. Moreover, signal names shown in upper case letters in FIG. 4B are replaced by corresponding names in lower case letters in Appendix A. Note that the initial state represented in the initial block of the Verilog shown in Appendix A corresponds to the reset state of the circuit under verification, i.e., tx_reg_1=0, tx_reg_0=1, rx_reg_1=0, and rx_reg_0=1.

As noted above, circuit 400 of FIG. 4B contains assertion 403 to check that the value stored in the rx_reg counter 411 is in fact one-hot (see lines 42-44 in Appendix A). The output of the one-hot assertion 403 becomes asserted when the assertion is "violated", if and only if the value stored in rx_reg counter 411 is not one-hot at the rising edge of the receive clock signal RX_CLK. During conventional RTL simulation, a violation flagged by the one-hot assertion 403 indicates that the value of the rx_reg counter 411 is not one-hot.

The just-described error in the rx_reg counter 411 is treated by a circuit designer as an indication that an error occurred in the generation of the one-hot signal but not that the one-hot signal was corrupted during transmission across clock domains. This is because conventional RTL simulators such as VCS and NC Verilog do not accurately model metastability affecting the CDC signals. Therefore, during conventional RTL simulation of the example circuit 400 of FIG. 4B, the value of the tx_reg counter is modeled as being correctly transmitted to the rx_reg counter, regardless of the violation of set up times (of registers 411_0 and 411_1). For this reason, when the one-hot signal is correctly generated and stored in the tx_reg counter 412 the one-hot assertion 403 that monitors the signal on path 107 is not violated during conventional RTL simulation.

As noted above, RTL simulation in the conventional manner produces only one outcome (i.e. one logic level) in the event of a setup time violation although two outcomes are possible. Moreover, RTL simulation also produces only one outcome (i.e. one logic level) in the event of a hold time violation, although two outcomes are possible. The inventors believe there is a need to take into account the outcomes that are not conventionally produced by RTL simulation. Specifically, the inventors believe that explicit modeling of all outcomes could lead to detection of errors that are not otherwise detected by RTL simulation.

It is well known in the art that the real behavior of a circuit in hardware often differs from the predictions made by conventional RTL simulation because of various physical effects. Thus, a circuit design that is verified using conventional RTL simulation may still have hidden errors that will affect the behavior of the final hardware circuit. In particular, circuit designers cannot rely on conventional RTL simulation tools to accurately and reliably determine whether a complex circuit design is able to reliably function in the presence of metastability on the outputs of registers receiving clock-domain-crossing signals.

Incorporated by reference herein in its entirety as background is an article entitled "Using Assertion-Based Verification to Verify Clock Domain Crossing Signals" by Chris Ka-Kei Kwok, Vijay Vardhan Gupta and Tai Ly presented at Design and Verification Conference (DVCon 2003), February, 2003.

SUMMARY OF THE INVENTION

Prior to verification of a description of a circuit containing a pre-determined assertion, the circuit description is automatically transformed in accordance with the invention by addition of description(s) of one or more circuits (also called "metastability injectors") to deliberately create one or more effects of metastability in the circuit. The transformed description (containing metastability injectors) is verified in the normal manner. Therefore, in some embodiments, use of metastability injectors during verification results in detection of incorrect behavior of the circuit (if present) that is caused by metastability in signals that cross clock domains in the circuit. Note that a circuit may be described in accordance with the invention (and the circuit description can be stored and used) in a programmed computer either in the form of HDL (such as Verilog or VHDL) or as an internal representation (such as a graph or a netlist).

During verification, certain embodiments analyze the transformed description using a formal verification method (such as model checking or. bounded model checking) to identify one or more specific stimulus sequence(s) that will cause the pre-determined assertion to be violated in simulation. One specific stimulus sequence identified by formal verification is used in simulation of the transformed circuit, to display to the circuit designer one or more simulation waveforms (on a computer screen) that indicate an incorrect behavior of the circuit in the presence of metastability. The circuit designer may analyze such simulation waveforms, to determine one or more sources of error, and if necessary change the circuit description to eliminate the incorrect behavior in a future iteration of verification (in the above-described manner). The designer may change the circuit description in any manner, including but not limited to implementing protocols to correctly transmit information between clock domains in the presence of metastability.

In accordance with embodiments of the present invention, novel verification techniques are provided that do not require transformation of the description of the circuit design. In one embodiment, improved RTL simulation provides appropriately timed injections of metastability effects at selected nodes to determine whether a circuit design will function properly when implemented in hardware.

The present invention models metastability effects during an RTL simulation test of a circuit-under-verification (CUV). The simulation test includes coverage monitors that measure the activity on each individual CDC signal and its associated clocks to identify deficiencies in the simulation test and to verify that the simulation test is adequate to verify that the CUV will function correctly when implemented in hardware and subjected to real metastability. At appropriate times during the simulation test, the effects of metastability are pseudo-randomly injected at selected nodes of the circuit.

These and other features as well as advantages that categorize the present invention will be apparent from a reading of the following detailed description and review of the associated drawings.

DETAILED DESCRIPTION

A preferred embodiment of the present invention provides verification of circuit designs and a method that facilitates the verification process. In particular, the present invention provides verification of circuit designs that contain multiple clock domains and where the clocks in at least two of the clock domains are asynchronous. In this type of circuit design, when a clock-domain-crossing (CDC) signal that originates in a transmit clock domain (TCD) is sampled in a different, asynchronous, receive clock domain (RCD), the output of the receiving register may become metastable and randomly settle to either 0 or 1. The logic in the circuit design that subsequently uses the output of the receiving register or a sequentially delayed version of the sampled signal needs to function correctly regardless of these "metastability effects".

For clarity, various well-known components have been omitted from the figures. However, those skilled in the art with access to the present teachings will know which components to implement and how to implement them to meet the needs of a given application. In the description herein for embodiments of the present invention, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, parts, and/or the like. In other instances, well-known structures, materials, or operations are not specifically shown or described in detail to avoid obscuring aspects of embodiments of the present invention.

In one embodiment of the invention, a description of a circuit-under-verification ("CUV") is automatically transformed so that it explicitly models the effects of metastability, resulting in a transformed description (hereinafter, also called the "transformed CUV"). The transformed description may be verified in any manner. Specifically, an original description of the CUV (which may be prepared by a circuit designer in the normal manner) is transformed, by insertion of an extra circuit to inject metastability effects into the path of a clock-domain-crossing signal. The extra circuit (also called "metastability injector") has an enable input that is used to conditionally inject metastability effects into the transformed CUV.

Figure 1A:
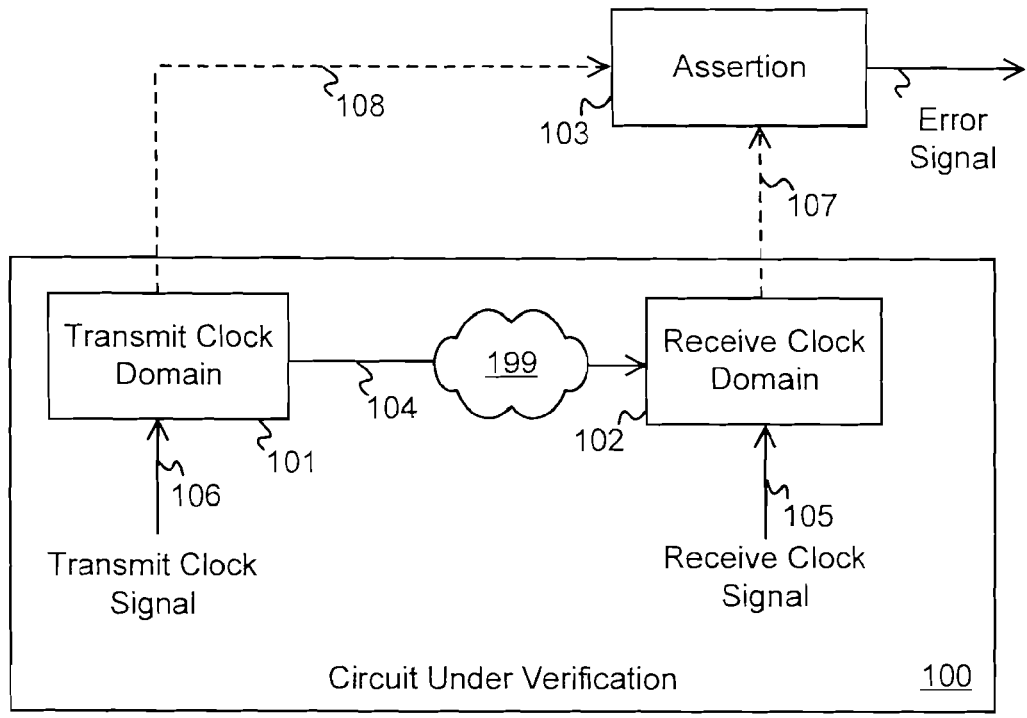
FIGS. 1A-1C illustrate, in block diagrams a prior art circuit with two clock domains, one CDC signal and one assertion.
Figure 5A:
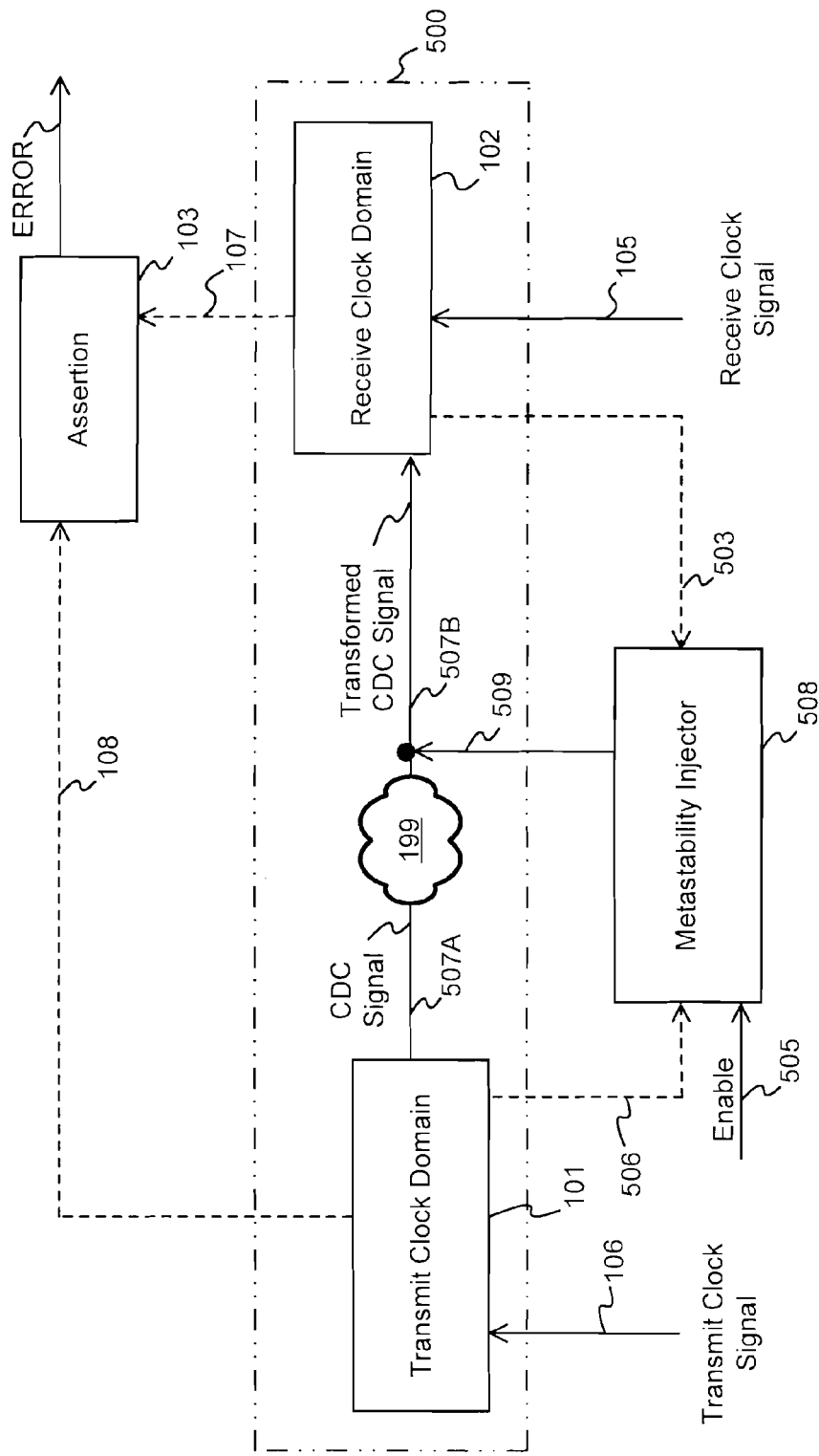
FIGS. 5A and 5B illustrate, in alternative embodiments, a metastability injector added in accordance with the invention, to the circuit-under-verification of FIG. 1A, to obtain a transformed circuit-under-verification.

FIG. 5A shows the result of transforming the original circuit 100 of FIG. 1A by adding a metastability injector 508. Note that the transmit clock domain 101 and receive clock domain 102 shown in FIG. 5A are similar or identical to the respective clock domains shown in FIG. 1A. Moreover, assertion 103 in FIG. 5A may also be same as or similar to an assertion 103 that is already pre-existing in an original circuit 100 (see FIG. 1A). Note that in some embodiments, a circuit designer may pre-determine (and optionally add) one or more assertions 103 for use with circuit 100, with such newly added assertions being intended to specifically detect errors resulting from metastability effects in the signal received on an input path 507B of the receive clock domain 102.

Note that in many embodiments, an assertion 103 that is violated as described herein is not deliberately selected but has only an indirect relationship to metastability (e.g. if the assertion is connected to the output of a register that is several sequential stages removed from the entry point of the CDC signal in the receive clock domain 102). Furthermore, in several embodiments, assertion 103 may be any assertion that monitors a portion of circuit 100 located in the transitive sequential fanout of the signal received on an input path 507B of the receive clock domain 102. Note that the transitive sequential fanout of signal S is a set of registers, R, constructed as follows: (a) set the set R to contain all registers with inputs in the combinational fanout of S; (b) repeat the following until the set R does not grow any larger: for each register X in the design if X is not already in R and an input of X is in the combinational fanout of some register in R, then add X to R.

In the embodiment of FIG. 5A, path 507A originates in the transmit clock domain 101 in the manner described above in reference to path 104 of FIG. 1A. Note that the clock-domain-crossing (CDC) signal which is output by transmit clock domain 101 does not travel on path 507A always unaltered to the receive clock domain 102 in FIG. 5A. Instead, the CDC signal on the path 507A of FIG. 5A is modified by metastability effects that are output by metastability injector 508 on a path 509 that is connected to path 507A. Input path 507B of the receive clock domain 102 is connected to paths 507A and 509, Hence, in the circuit 500 of FIG. 5A, path 507B carries the modified CDC signal (also called 'metastable CDC signal') to the receive clock domain 102. Note that the above-described combinational logic 199 may be present between paths 507A and 507B at any location relative to path 509 (i.e. although in FIG. 5A path 507A is shown passing through logic 199 and path 509 is directly connected to path 507B, other embodiments may have path 507B passing through combinational logic 199 with path 509 being directly connected to path 507A, while still other embodiments may have both paths 507A and 507B passing through different portions of combinational logic 199). Therefore, the specific connections among paths 507A, 507B, 509 and combinational logic 199 are different depending on the embodiment.

Note that metastability injector 508 may add any kind of metastability effect to the CDC signal generated by transmit clock domain 101, depending on the embodiment. In some embodiments, metastability injector 508 simply inverts the CDC signal from path 507A, whenever there is a transition in the CDC signal. An inversion forced by metastability injector 508 may be disabled (so the result is same as in RTL simulation) or the forced inversion may be timed to happen at various times relative to the set up and hold times of the receiving register (not shown in FIG. 5A; see register 111 in FIG. 1A).

Specifically, metastability injector 508 may be disabled (by de-asserting an enable signal on path 505) all the time, in which case the CDC signal is left unaltered. Alternatively, metastability injector 508 may be disabled only until it becomes time for the transmit clock signal on path 106 to align with the receive clock signal on path 105 at which time metastability injector 508 is enabled. In some embodiments, the enable signal on path 505 is output by an AND gate (not shown) that receives as input a signal that is asserted during alignment of the two clock signals, and as another input a signal indicating that injector 508 is activated. Note that AND gate 524 is a 3-input gate that additionally receives the signal that is asserted during alignment (in addition to the signal on path 505 and the output of gate 523). The times at which two clock signals are considered to be aligned, depends on the particular embodiment. For example in some embodiments, the clock signals are considered to be aligned if the time between the rising edge of the transmit clock and the rising edge of the receive clock is less than the setup time of the receiving register, or if the time between the rising edge of the receive clock and the rising edge of the transmit clock is less than the hold time of the receiving register.

For example, in some embodiments, whenever there is a transition in the CDC signal (assuming it happens when the clocks are considered to be aligned), the modified CDC signal that is presented at the input of the receive clock domain 102 is obtained by the metastability injector inverting the CDC signal (i.e. the logic value is driven from 1 to 0 and from 0 to 1). Thus, when the next active edge of the receive clock occurs in the receive clock domain 102 (FIG. 5A), the value that is stored in the receiving register in clock domain 101 models the situation in which the physical receiving register (e.g. register 111 in FIG. 5C) enters the metastable state in the physical world and settles to the inverse of the logic value that would be produced by conventional RTL simulation of the non-transformed circuit.

In many embodiments of the type described herein, metastability injector 508 may be disabled by de-asserting a signal on a path 505 (FIG. 5A). Specifically, when the signal (also called "metastability enable") on path 505 is asserted, the metastability injector of such embodiments forces the receive clock domain 102 to clock a modified CDC signal into the receiving register 111. The modified CDC signal is either the unaltered version of the CDC signal when there is no transition in the CDC signal, or the inverted version of the CDC signal if there is a transition in the CDC signal.

When the metastability enable signal on path 505 is de-asserted, the metastability injector of such embodiments is disabled and hence it unconditionally allows the receive clock domain 102 to receive the unaltered version of the CDC signal (i.e. regardless of whether or not a transition is happening in the CDC signal). Thus, when an active edge of the receive clock occurs with the enable signal on path 505 deasserted, the value stored in the receiving register of receive clock domain 102 models the situation in which the physical receiving register enters the metastable state and settles to the same logic value as would be produced by conventional RTL simulation of the non-transformed circuit.

Note that a metastability enable signal of the type described above in reference to path 505 does not exist in the original description of circuit 100 (FIG. 1A), but this signal is used as a primary input during verification (e.g. in formal verification) to turn on and off metastability effects. Use of such a metastability enable signal introduces one primary input into the formal analysis for each clock-domain-crossing signal (i.e. over and beyond any primary inputs present in the original description of circuit 100). Therefore, if transformed circuit 500 has an n-bit bus that connects transmit clock domain 101 to receive clock domain 102, then "n" enable inputs are now present, to conditionally turn and off the metastability effects in each of the "n" CDC signals. Transformed circuit 500 (FIG. 5A) models each of the two possible outcomes for receipt of each CDC signal in a receiving register in clock domain 102 to model metastability effects, depending on whether the enable signal on path 505 is asserted or deasserted.

Note that, if assertion 103 is found to be not violated regardless of whether one or more metastability injector(s) 508 are enabled or disabled, then the design of circuit 500 is deemed to be verified to withstand metastability effects. On the other hand, if assertion 103 is violated when one of the metastability injector(s) 508 is enabled, the circuit designer may re-design circuit 500 to withstand metastability effects. Note that due to a change in the path between the two clock domains 101 and 102, the clock domains 101 and 102 in FIG. 5A are together referred to as circuit 500 (instead of circuit 100 as per FIG. 1A).

Certain embodiments of metastability injector 508 that are responsive to a transition in the clock-domain-crossing (CDC) signal, may detect the transition, inter alia, by use of one or more signals on path 506 from the transmit clock domain 101 or one or more signals on path 503 from the receive clock domain 102 or signals on both paths 503 and 506. Some embodiments of metastability injector 508 that are responsive to the transition in the CDC signal do not use any additional signals from clock domains 101 and 102, and instead directly monitor the CDC signal alone, to detect the transition. In the just-described embodiments, the metastability injector 508 does not have paths 503 and 506. The specific circuitry to be used in such a metastability injector 508 will be apparent to the skilled artisan in view of this detailed description.

Figure 5B:
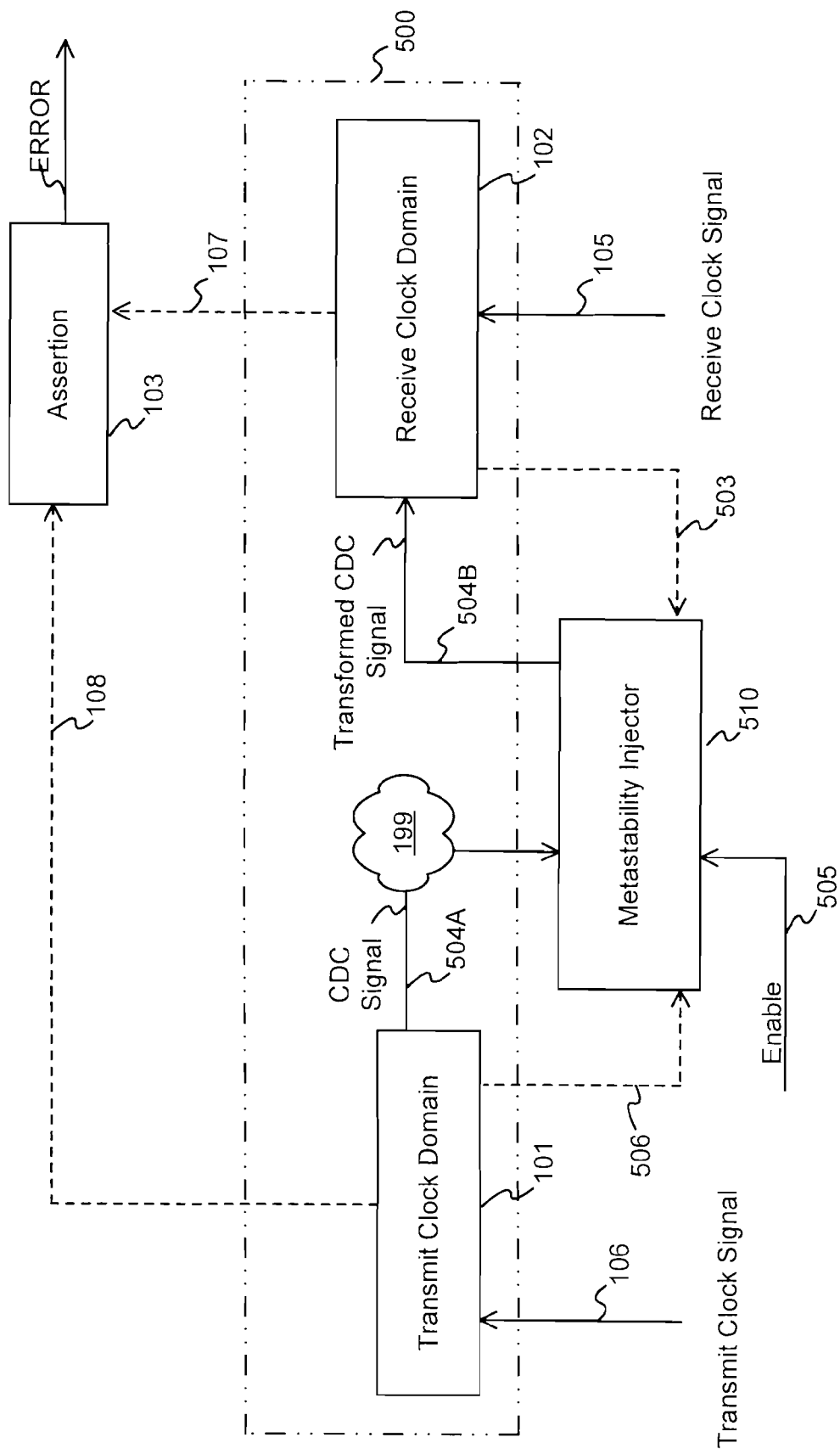

In another embodiment which is illustrated in FIG. 5B, a path 504A that carries the clock-domain-crossing (CDC) signal from the transmit clock domain 101 is not directly connected to a path 504B that passes the modified CDC signal to the receive clock domain 102. Instead, path 504A terminates in metastability injector 510, and another path 504B originates in the metastability injector 510. The modified CDC signal is supplied on path 504B by injector 510, and this signal includes metastability effects therein.

Figure 1B:
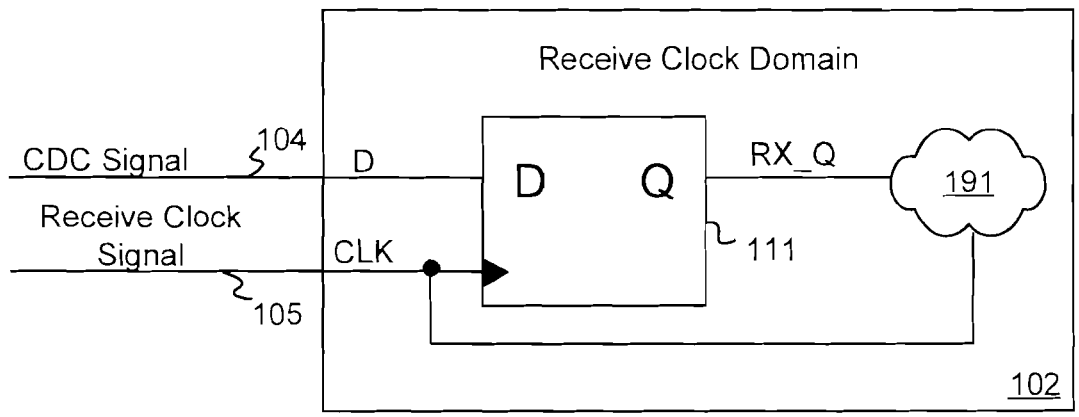
Figure 1C:
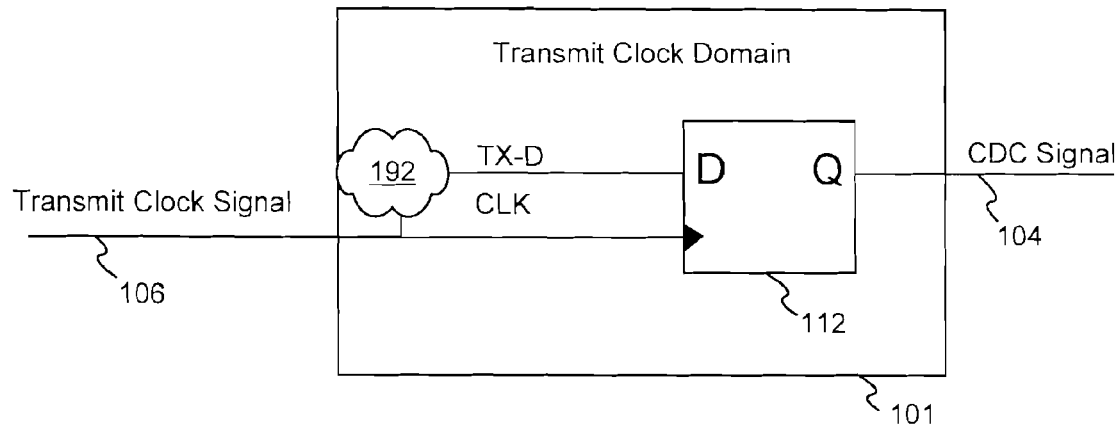

In other embodiments, which are not shown, path 504B of metastability injector 510 may be coupled to the transmit clock domain 101 (e.g. to insert metastability effects into an earlier version of the CDC signal between the additional circuitry 192 and the last register 112 in the transmit clock domain 101 of FIG. 1C). In still other embodiments, which are also not shown, path 504B may be coupled between the additional circuitry 191 and the first register 111 in the receive clock domain 102 of FIG. 1B (e.g. to insert metastability effects into a later version of the CDC signal).

Metastability injector 510 of FIG. 5B can be implemented in any manner depending on the embodiment. In some embodiments, metastability injector 510 enabled by the signal on path 505, uses two versions of the clock-domain-crossing (CDC) signal to detect if a transition is happening in the CDC signal on path 504A. The two versions of the CDC signal may be, for example, the CDC signal on path 504A and an early version of the CDC signal obtained from the input of last register 112 in the transmit clock domain 101 (e.g. from the data input of the transmitting register in clock domain 101, i.e., the TX_D signal).

Figure 5C:
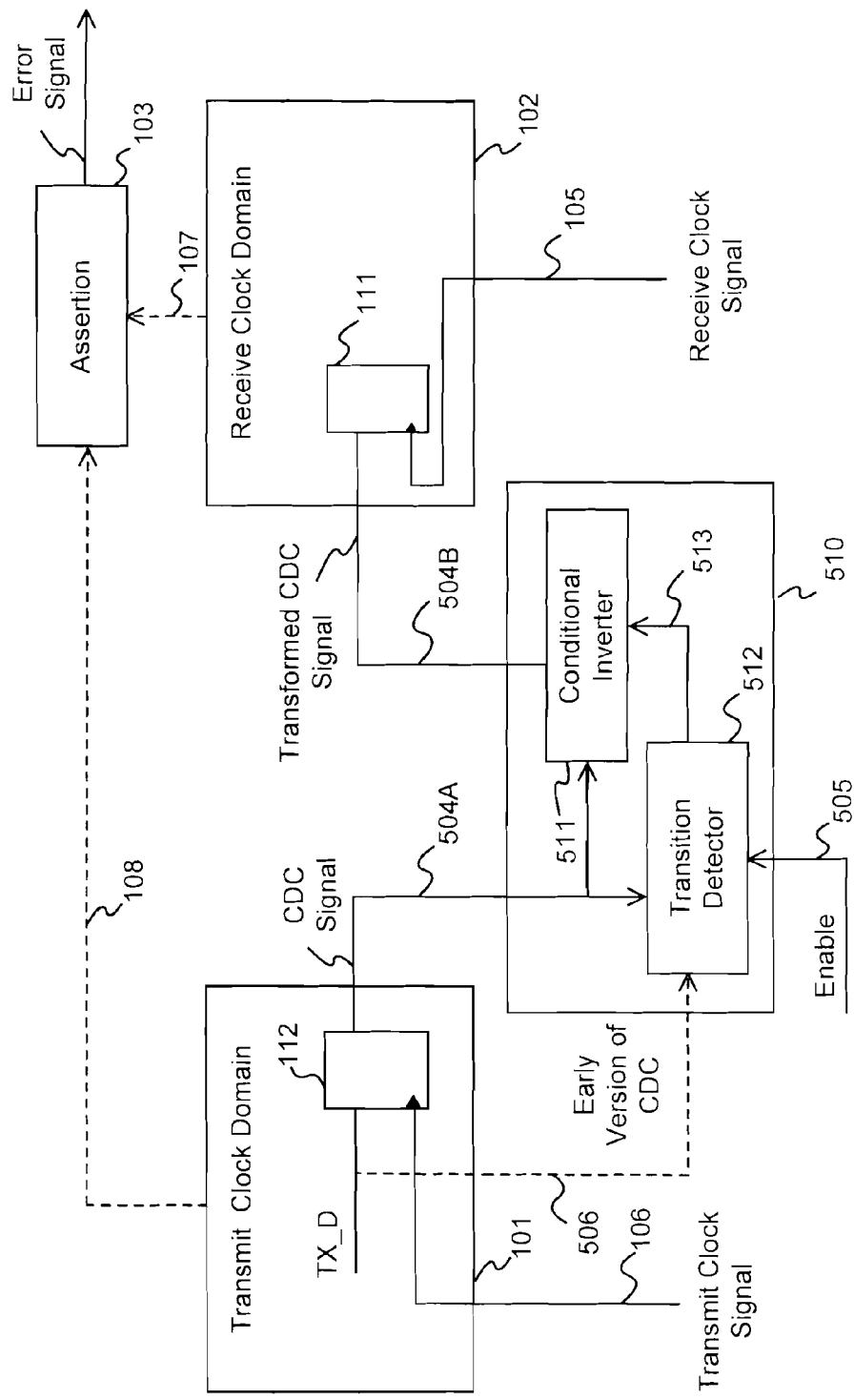
FIG. 5C illustrates, in a lower level block diagram, a transition detector and a conditional inverter that are included in a metastability injector of some embodiments of the invention.

Such an early version of the CDC signal may be obtained via the above-described path 506 (FIG. 5C) from transmit clock domain 101. In such embodiments, the early version of the CDC signal is compared with the CDC signal itself, in circuitry 512 (called "transition detector") that is located within metastability injector 510. Any difference between the two versions of the CDC signal is indicated by transition detector 512 asserting a signal at its output on a path 513 (FIG. 5C). Note that in the embodiments illustrated in FIG. 5C, the enable signal on path 505 is supplied directly to transition detector 512 to enable or disable its operation (when disabled, the signal on path 513 is deasserted regardless of transitions on path 504A). Note also that although in some embodiments transition detector 512 has been described and illustrated as comparing two versions of the CDC signal (i.e. the logic values on paths 506 and 504A), in other embodiments the transition detector may use only the CDC signal itself as noted above.

Figure 5D:
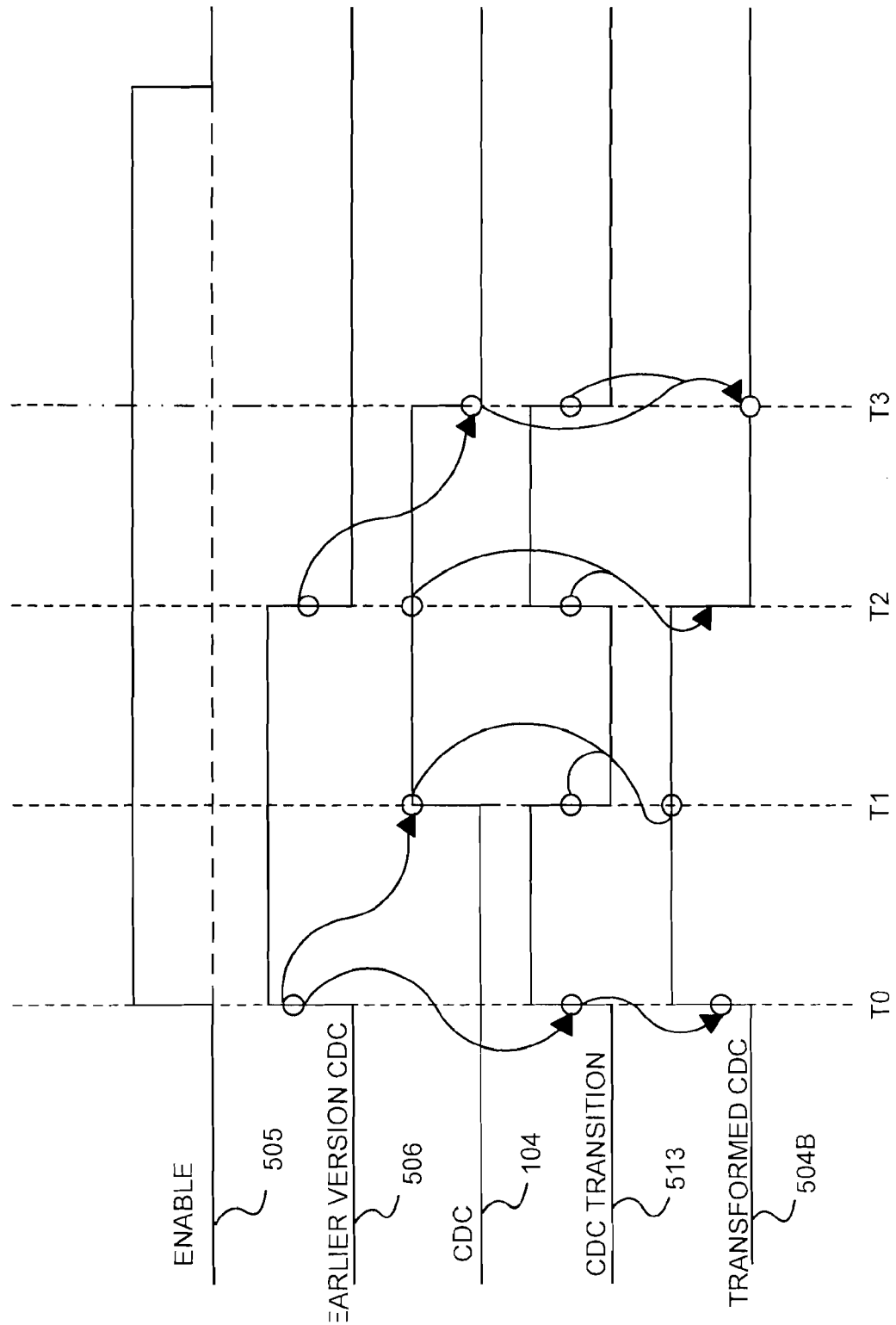
FIG. 5D illustrates, in a graph, waveforms of various signals in a metastability injector of one embodiment.

In some embodiments, transition detector 512 compares a current version of the CDC signal with an early version of the CDC signal, to detect whether a transition is going to happen in the CDC signal at the next clock cycle. The signal generated by transition detector 512 on path 513 (also called CDC transition) is illustrated in FIG. 5D in the case of a CDC signal on path 504A (FIG. 5C) that is low at time T0, goes high at time T1 and stays high for two clock cycles and goes low at time T3. As shown in FIG. 5D, the early version of the CDC signal on path 506 exhibits the same behavior as the CDC signal on path 504A but it is shifted earlier by one clock cycle. The CDC transition signal on path 513 goes high for one clock cycle before the CDC signal goes high i.e. between times T0 and T1. The CDC transition signal on path 513 also goes high for one clock cycle before the CDC signal goes low i.e. between times T2 and T3.

Referring to FIG. 5C, the CDC transition signal on path 513 controls a circuit 511 that is also included in metastability detector 510 of these embodiments. Circuit 511 (also called 'conditional inverter') conditionally supplies on path 504B (to the receive clock domain 102), either an inverted version or an unaltered version of the CDC signal received on path 504A (from the transmit clock domain 101), depending on whether or not the signal on path 513 is asserted. As noted above, the signal on path 513 is asserted by the transition detector 512 whenever there is a transition in the CDC signal on path 504A.

In the above-described example, the CDC transition is high between times T0 and T1 (as shown in FIG. 5D) which causes the modified CDC signal on path 504B to go high between times T0 and T1 (inverse of the low value in the CDC signal between times T0 and T1). Note that at time T1, the CDC transition signal becomes low and hence the modified CDC signal goes high (due to pass-through of the high value in the CDC signal between times T1 and T2). The remaining transitions at times T2 and T3 in the modified CDC signal are shown in FIG. 5D and their behavior will be apparent to the skilled artisan in view of this detailed description.

Depending on the embodiment, an early version of the CDC signal for use in a transition detector 512 as described above may be obtained from an input of any storage element in the transmit clock domain 101, in the transitive sequential fanin of CDC signal. Transitive sequential fanin of the CDC signal is consistent with use of this term in art, i.e. a set of registers, R, constructed as follows: (1) set the set R to contain all registers with outputs in the combinational fanin of S; (2) repeat the following until the set R does not grow any larger: for each register X in the design, if X is not already in R and the output of X is in the combinational fanin of some register in R, then add X to R. As noted above, some embodiments use as the early CDC signal a signal that is received from additional circuitry 192 (FIG. 1C) at the input of the very last storage element 112 in the transmit clock domain 101 that supplies the CDC signal.

Also note that in other embodiments, instead of an early version of the CDC signal, a later version of the CDC signal may be used in a transition detector in a manner identical to that described above (although the transition detection will occur later). As noted above, depending on the embodiment, a transition detector 512 in metastability injector 510 may use only the CDC signal itself as input (instead of two versions of the CDC signal).

Figure 5E:
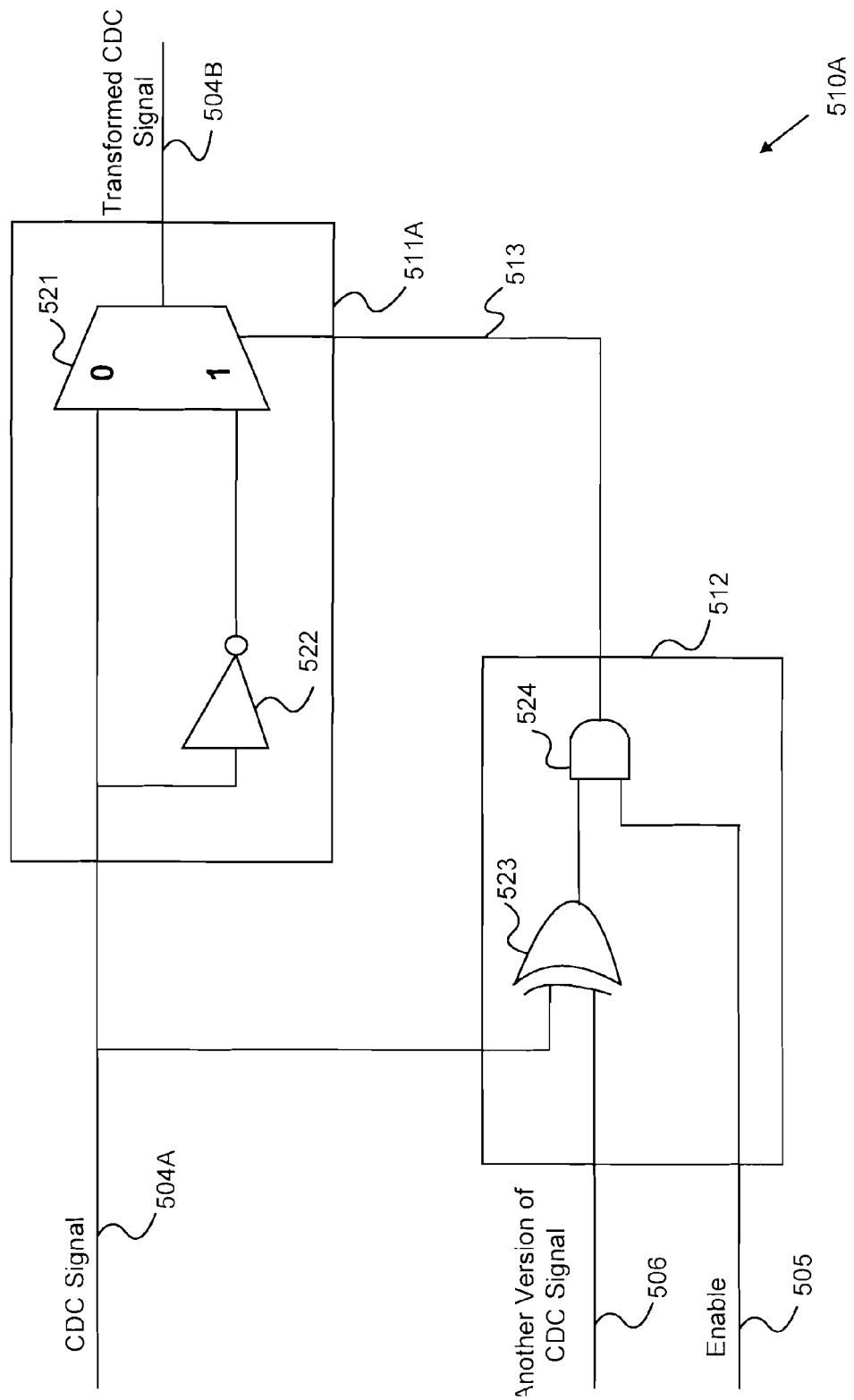
FIGS. 5E and 5F illustrate two exemplary implementations of a metastability injector of some embodiments.
Figure 5F:
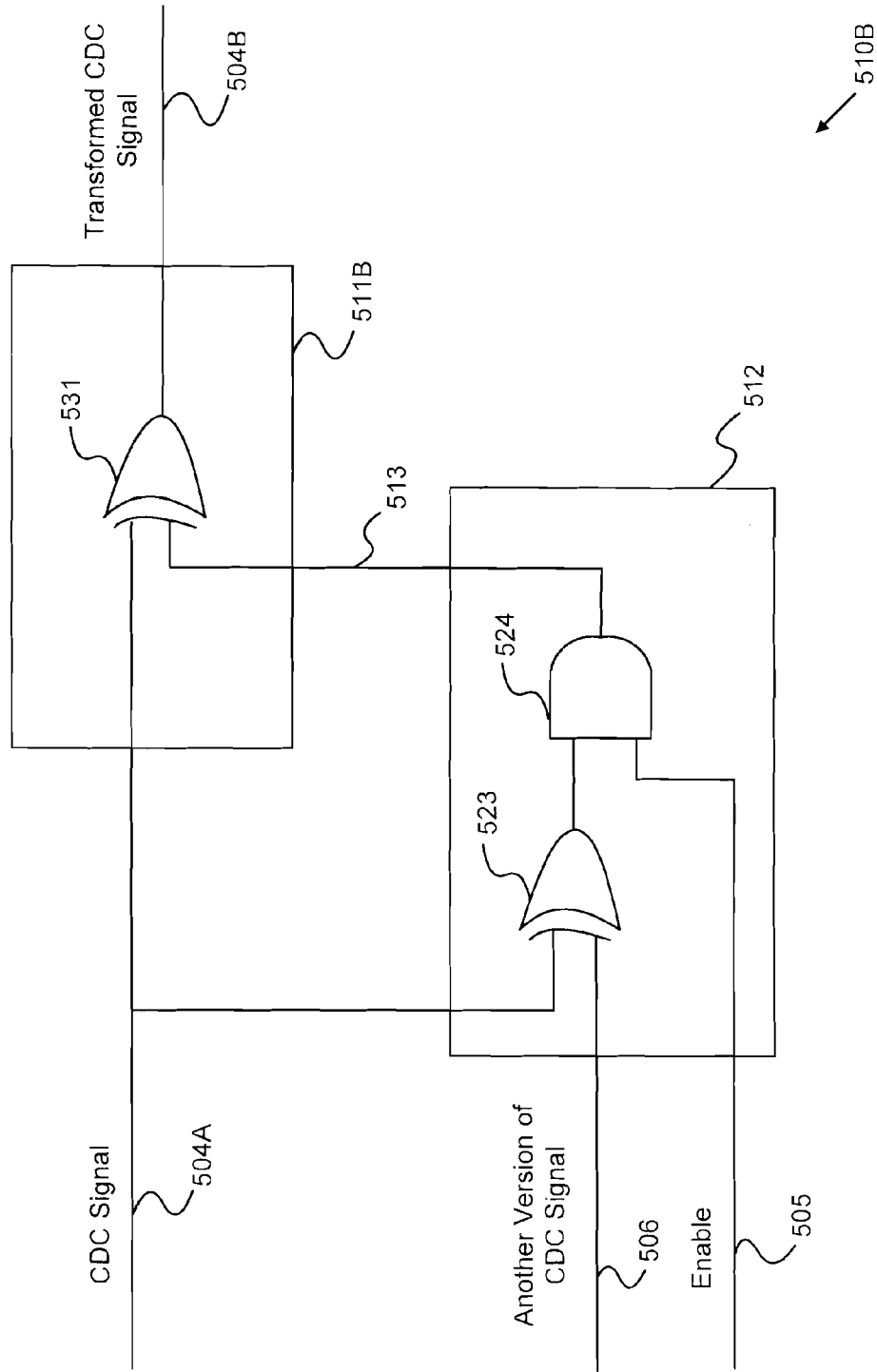

FIGS. 5E and 5F illustrate two alternative embodiments of a metastability injector 510 of the type illustrated in FIG. 5C, although numerous such embodiments will be apparent to the skilled artisan in view of this detailed description. Accordingly several features illustrated in FIGS. 5E and 5F are merely educational and are not intended to limit the scope of the invention. In both embodiments illustrated in FIGS. 5E and 5F, a transition detector 512 is implemented by an exclusive OR gate 523 that receives the two versions of the clock-domain-crossing (CDC) signal on paths 504A and 506, and an output signal from gate 523 is supplied to an AND gate 524 that also receives as input the above-described metastability enable signal on path 505. The signal output by AND gate 524 is supplied as the CDC transition signal on path 513.

Note, however, that conditional inverter 511 of metastability injector 510 is implemented differently in the two embodiments illustrated in FIGS. 5E and 5F, as noted next. Specifically, one conditional inverter 511A which is illustrated in FIG. 5E has a multiplexer 521 that is controlled by the CDC transition signal on path 513 to supply one of two inputs to path 504B, namely either the CDC signal directly from path 504A or an inverted form of the CDC signal generated by an inverter 522 (that is also coupled to path 504A). Another conditional inverter 511B which is illustrated in FIG. 5F has an exclusive OR gate 531 that receives as its two inputs, the CDC transition signal on path 513 and the CDC signal directly from path 504A. The output of the exclusive OR gate 531 is directly supplied as the modified CDC signal on path 504B.

Many alternative embodiments of the metastability injector will be apparent to a person skilled in the art, including embodiments that use signals from the transmit clock domain other than the CDC signal and the TX_D signal at the "D" input of the transmitting register 112 (see FIG. 1C).

Figure 6A:
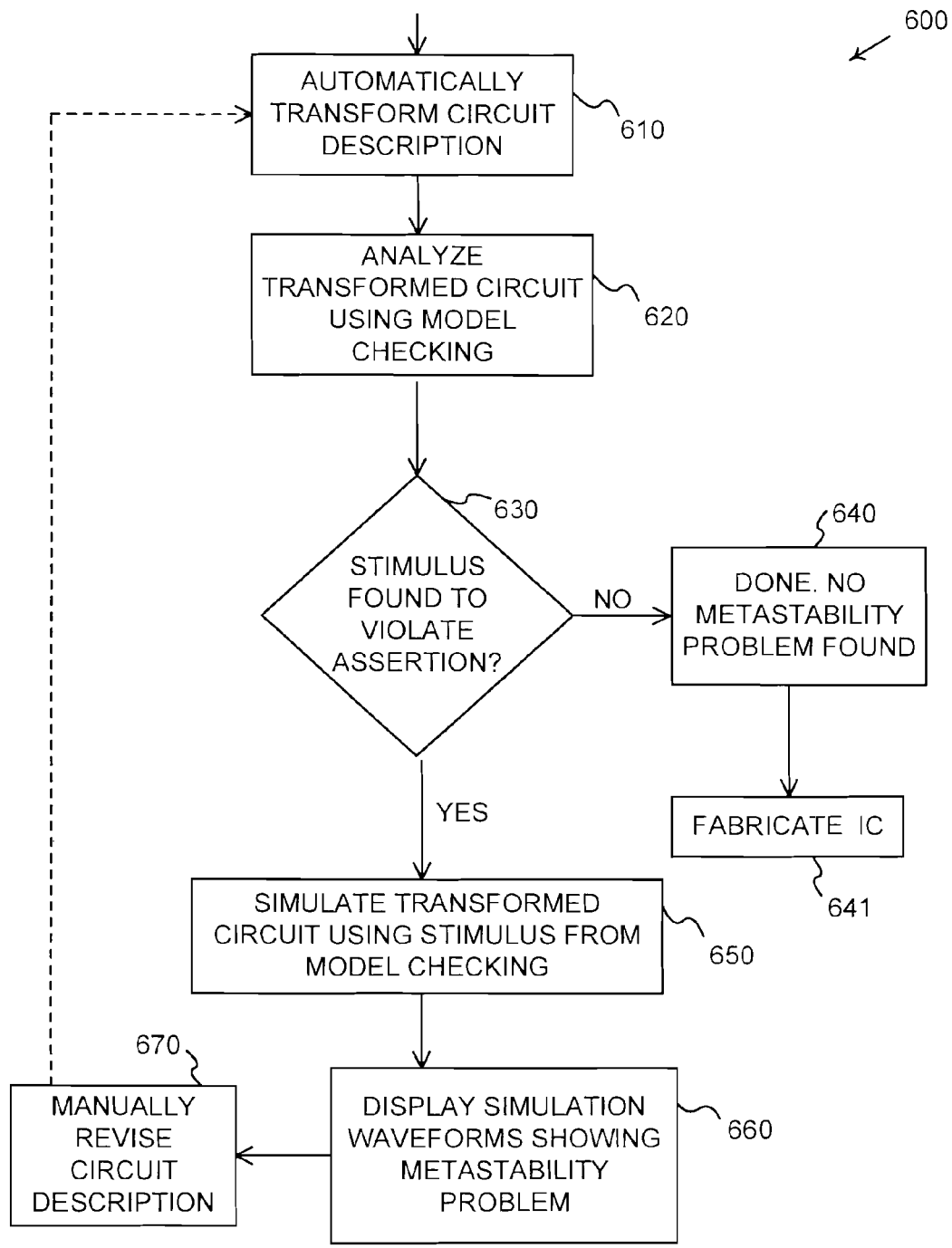
FIG. 6A illustrates, in a flowchart, one embodiment of the method of the invention.
Figure 6B:
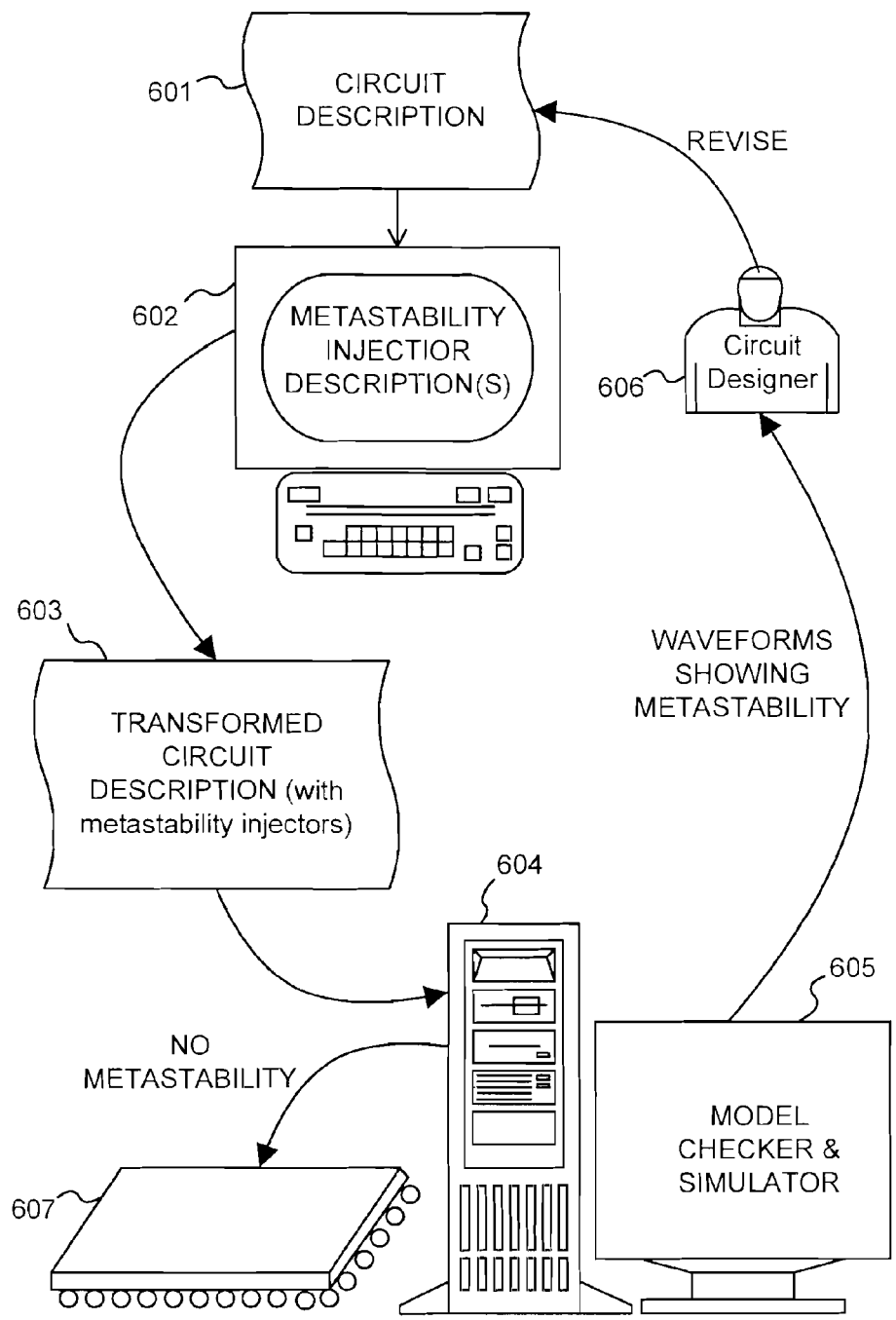
FIG. 6B illustrates, in a high-level block diagram, a flow of information when performing the method of FIG. 6A.

A verification method 600 used in some embodiments of the invention is illustrated in FIG. 6A. Specifically, a description 601 (e.g. expressed in Verilog, or VHDL) of the circuit under verification (see FIG. 6B) is automatically transformed by programmed computer 602 as per act 610 (FIG. 6A), by adding description of circuitry to inject effects of metastability into the circuit under verification, resulting in a transformed description 603. Specifically, one or more metastability injectors of the type described above in reference to FIGS. 5A and 5B may be added by computer 602 in act 610, to obtain the transformed description 603. Note that the metastability injectors are added for each CDC signal in circuit description 601.

Each CDC signal in description 601 is found automatically as follows by computer 602 that is appropriately programmed as follows. Computer 602 looks at each register in description 601 and checks if the register's combinational fan-in contains another register and if so, whether these two registers have different clock signals. If they do have different clock signals, then the signal between the two registers is deemed to be a CDC signal. Next, a metastability injector is inserted in the manner described herein, for the just-found CDC signal.

Note that some embodiments build a netlist from the description 601, and traverse the netlist for each register, to find all registers that drive the data input of the current registers and if any of these registers are clocked by a different clock then the path between the two registers with different clocks is a CDC signal. Note that only combinational logic (in terms of logic elements) separates these two registers with different clocks.

Note that circuit description 601 may or may not contain one or more pre-determined assertion(s) of the type described above, depending on the embodiment. For example, in some embodiments, circuit description 601 does contain pre-determined assertions and these assertions remain unchanged in the transformed description 603. In other embodiments, circuit description 601 does not contain pre-determined assertions and instead these assertions are held in a separate file, and they are added to the circuit description from the separate file after addition of metastability injectors as described above in reference to act 610. Note that regardless of when added, transformed description 603 contains one or more pre-determined assertions and one or more metastabiltiy injectors.

The transformed description 603 is analyzed by a computer 605, as per act 620, using any method well known in the art. In many embodiments, act 620 involves performance of a formal verification method (such as bounded model checking in some particular embodiments). Note that although computer 605 is used in some embodiments to perform a formal verification method on description 603, act 620 may be performed in other embodiments by computer 602 (that performed act 601), or act 620 may even be performed manually in still other embodiments.

Note that when the same computer 602 performs both acts 610 and 620, in some embodiments a transformed circuit description 603 is an internal representation (e.g. in the form of a graph) of the circuit 100 and is directly transformed by addition of metastability injectors as per act 610 and the resulting transformed internal representation is used directly during analysis in act 620.

If the analysis in act 620 (FIG. 6A) finds a stimulus sequence that will cause the assertion in the transformed circuit description 603 (FIG. 6B) to be violated, during conventional RTL simulation of the transformed description 603 (as per act 630 in FIG. 6A), then a metastability problem has been found. Model checking in act 620 may use a Boolean formula that is TRUE if and only if the underlying state transition system can realize a sequence of state transitions that reaches certain states of interest within a fixed number of transitions. If such a sequence cannot be found at a given length, k, the search is continued for larger k. If a limit "L" is reached without finding a sequence, the circuit designer may conclude that there are no errors sourced from metastability effects and therefore use the circuit description (without metastability injectors) to fabricate (as per act 641) an integrated circuit die 607, which may be tested and used in the normal manner.

In act 620 if a stimulus sequence to violate the assertion is found, the "yes" branch in act 630 (FIG. 6A) is taken, and act 650 is performed by computer 605 in some embodiments or by computer 602 in other embodiments. In act 650, the transformed circuit description 603 is simulated using the stimulus sequence determined in act 620 (FIG. 6A).

Next, in act 660, the simulation waveforms are displayed on a computer screen (e.g. screen 605 in FIG. 6B) so that a circuit designer 606 may diagnose the metastability problem. The circuit designer 606 may then revise their original circuit description as per act 670, and the revised description is optionally again subjected to acts 610-660 (e.g. act 610 is performed again by computer 602 this time on the revised circuit description, to generate another transformed description followed by analysis as per act 620 and so on).

If the model checking performed in act 620 does not find any stimulus sequence that will cause the assertion to be violated in conventional RTL simulation of the transformed circuit description 603, then act 640 is performed, and the circuit description 601 (or the revised circuit description) is deemed to not have a metastability problem (and a message to this effect is displayed on the computer screen).

Figure 6C:
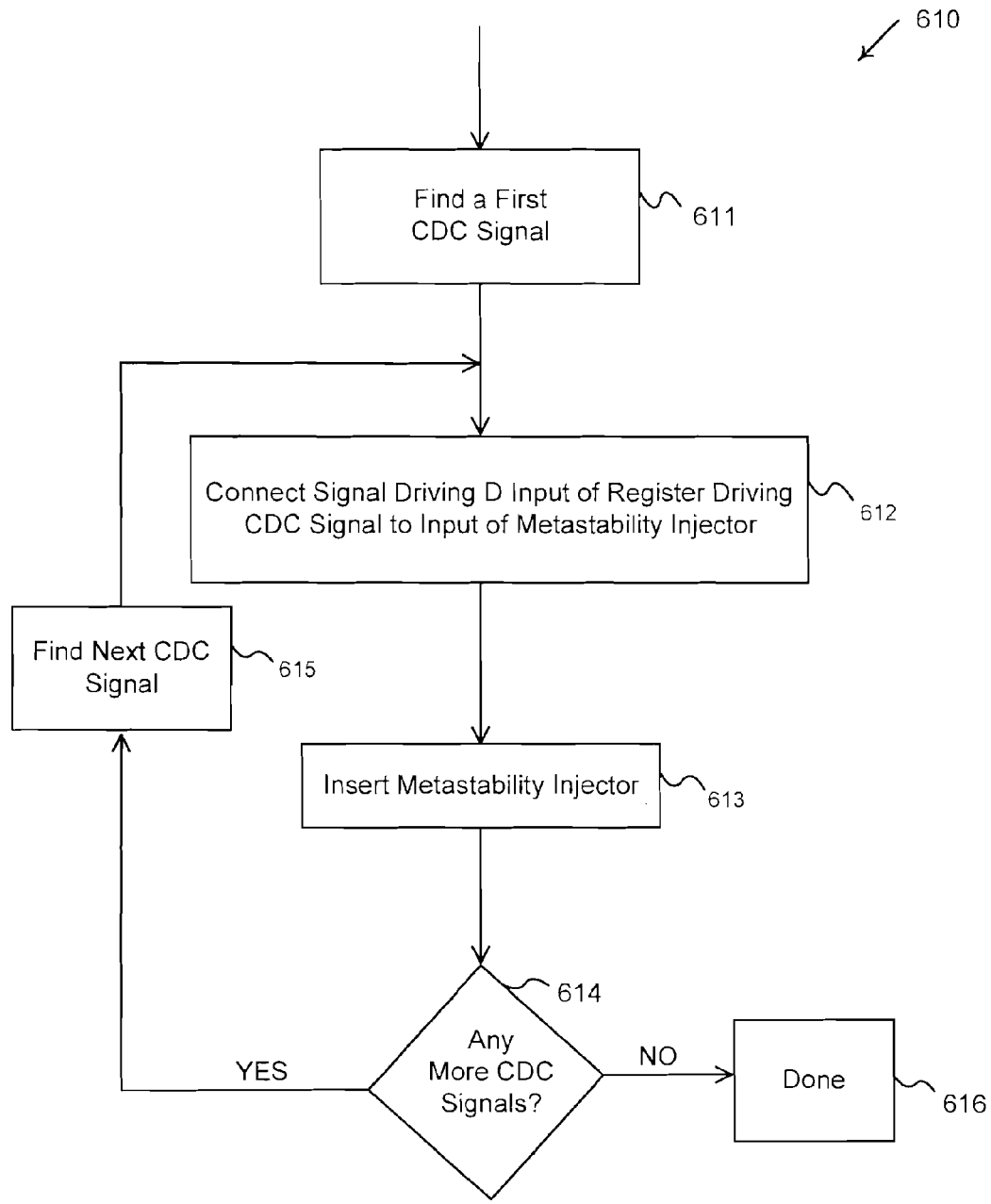
FIG. 6C illustrates, in a flowchart, one exemplary implementation of an act of transformation 610 in FIG. 6A.

FIG. 6C illustrates one embodiment of an implementation of the transformation act 610 of FIG. 6A that automatically transforms the description of the circuit under verification by adding metastability injectors. Specifically, in act 611, a path of a clock domain crossing signal is found in the circuit description 601 that is to be transformed, and this path is set as the current path.

Next in act 612, the current path is replaced by (a) an input path to a metastability injector, (b) the metastability injector itself, and (c) an output path from the metastability injector. Additional connections that may be required, depending on the internal design of the metastability injector are also made in act 612, as appropriate. For example, a path carrying the TX_D signal which is connected to the D input of register 112 (FIG. 5C) that drives the clock-domain-crossing (CDC) signal is determined and this path is connected (as per act 612 in FIG. 6C) to path 506 of metastability injector 510 (FIG. 5C).

Next, in act 613, the metastability injector 510 itself is inserted into the path of the CDC signal. Specifically, an input path 504A of the metastability injector 510 is connected to the Q output of register 112 (FIG. 5C). Finally, an output path 504B of metastability injector 510 is connected to the D input of the register of the receive clock domain 102 (see register 111 in FIG. 5C). Next, in act 614, a check is made as to whether any more CDC signals exist and if so, the path of the next CDC signal is set as the current path and control returns to act 612 (described above). If there no more CDC signals, then the transformation is completed (as per act 616 in FIG. 6C).

Figure 6D:
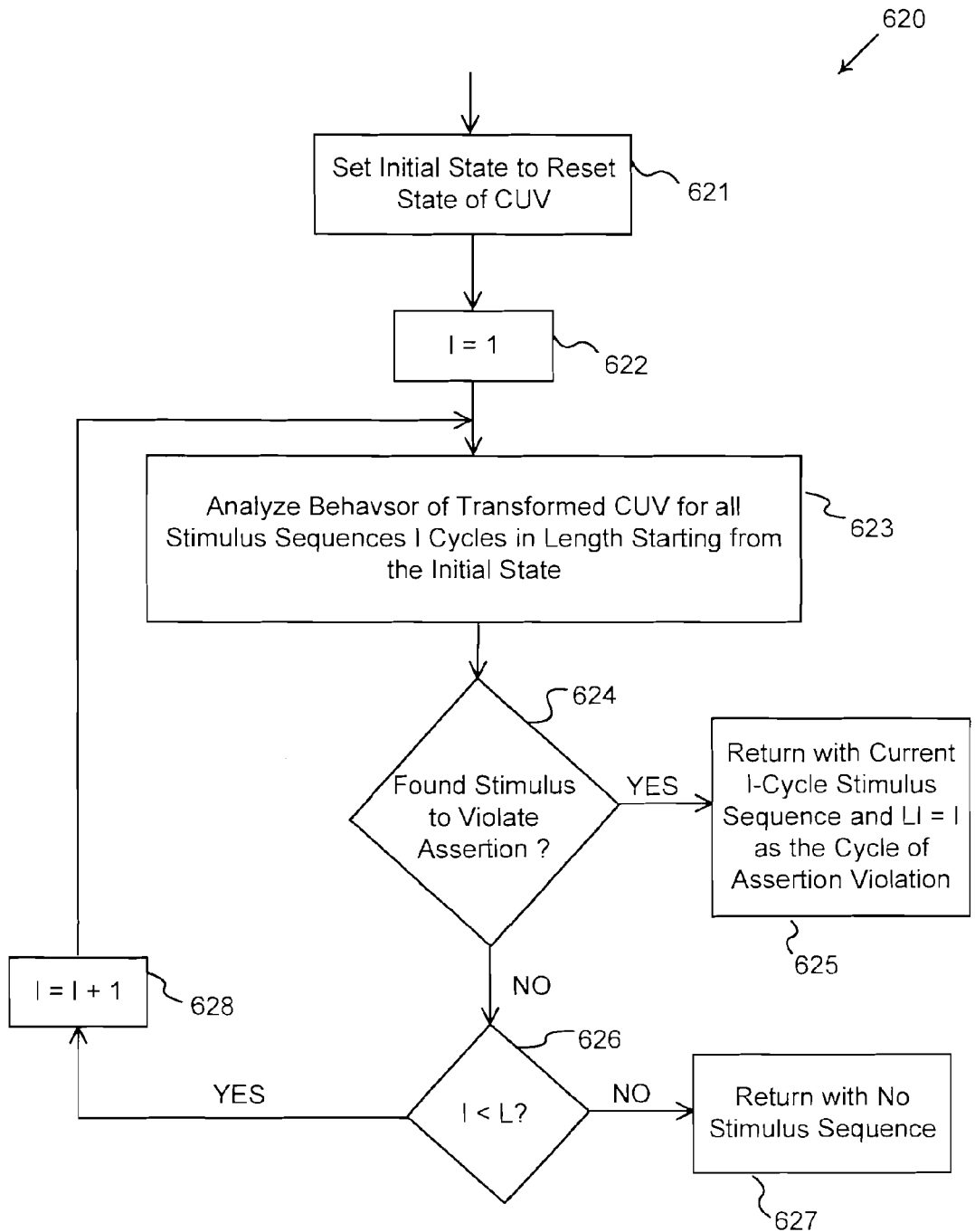
FIG. 6D illustrates, in a flowchart, one exemplary implementation of an act of analysis 620 in FIG. 6A.

FIG. 6D illustrates an implementation of the analysis act 620 of FIG. 6A in some embodiments. In these embodiments, a model checking method is used to analyze the transformed circuit description 603 resulting from act 620 (or the transformed circuit model as noted above) to find a stimulus sequence that will cause the assertion to be violated during conventional RTL simulation of the transformed circuit description. In such embodiments, an initial state for the model checking analysis may be set (as per act 621) to a reset state (which may be any one of several reset states) that the transformed circuit under verification (also called "transformed CUV") may have.

Depending on the circuit design, one of the reset states may be for all registers to be set to logic value 0, whereas other reset states may be for one or more of the registers to be set to logic value 1 while all other registers are set to logic value 0, or for some registers to be set to a state representing "don't care" (i.e., the register can be assigned either logic value 0 or logic value 1 during formal analysis). Note that an initial state for use in model checking in act 620 may be manually selected by a user to be any state. Alternatively, an initial state may be obtained from test-benches used in simulation (e.g. in a commercially available simulator such as VCS from Synopsys, Mountain View, Calif.).

Next, a cycle identifier I is set to 1 in act 622 and control is transferred to act 623. In act 623, the behavior of the transformed circuit is analyzed for all stimulus sequences I cycles in length, starting from the initial state. As noted above, in act 622 the cycle identifier was set to 1 and therefore the analysis in this first iteration is for only 1 cycle in length, although in later iterations that reach act 623 from act 628 the analysis becomes deeper (if no assertion is violated).

Then, in act 624, a check is made to see if a stimulus sequence is found that will cause the assertion to be violated, and if so the yes branch is taken and act 625 is performed. Specifically, the model checking method is concluded and the stimulus sequence is returned along with the current cycle (e.g. variable "LI" is set to I). If in act 624, the stimulus sequence is not found, then control is transferred to act 626. In act 626, a check is made as to whether a predetermined limit L on the cycle identifier I has been reached and if not then I is increased by one, and the process is iterated (returning to act 623). If the predetermined limit L was reached, then the model checking is concluded in act 627, and returns with no stimulus found.

Many alternative methods of selecting an initial state for the model checking method (as per act 621 in FIG. 6D) will be apparent to a person skilled in the art, including: selecting an initial state that is a non-reset state of the circuit under verification ("CUV"); selecting an initial state from simulation of the; selecting an initial state by analyzing waveforms from simulation of the CUV; selecting an initial state from simulation such that at least two simulated clock edges are aligned to allow metastability to occur according to the setup and hold time parameters of a register in the; and using a programmed computer to automatically determine an initial state. Similarly, it will be apparent to a person skilled in the art that an initial state for the model checking method can represent all reachable states of the CUV.

Many alternative embodiments of the model checking method 620 will be apparent to a person skilled in the art in view of this detailed description. Several such embodiments use one of the model checking methods described in "Model Checking", E. Clarke, O. Grumberg, and D. Peled, MIT Press, 1999, and in "Bounded model checking using satisfiability solving," E. Clarke, A. Biere, R. Raimi, and Y. Zhu, Formal Methods in Systems Design, 19(1):7-34, 2001 in place of the model checking method 620 shown in FIG. 6D. The just-described two papers are incorporated by reference herein in their entirety.

Figure 6E:
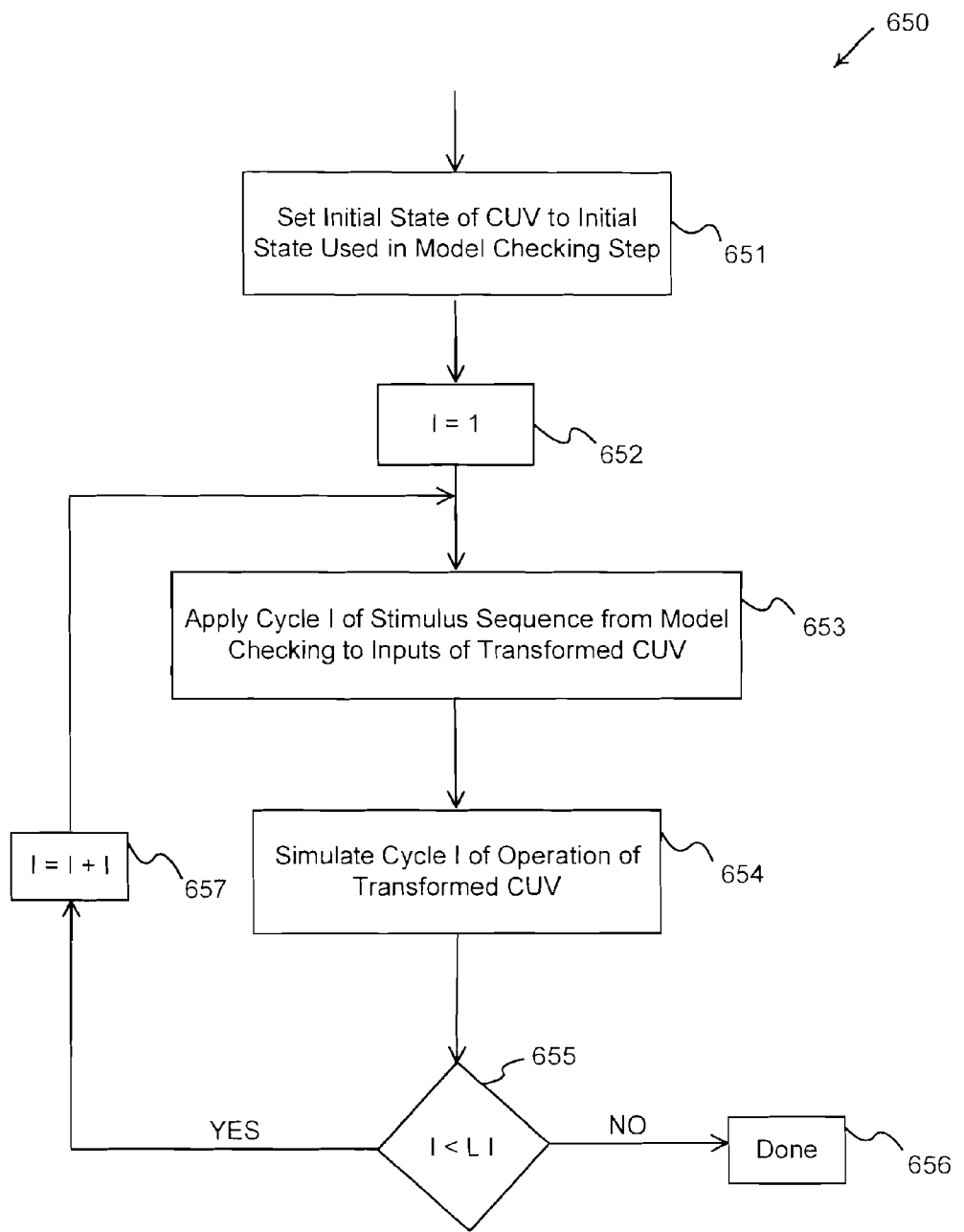
FIG. 6E illustrates, in a flowchart, one exemplary implementation of an act of simulation 650 in FIG. 6A.

FIG. 6E shows one embodiment of a simulation act 650 of FIG. 6A. Specifically, in act 651, the initial state of the transformed CUV is set to the initial state used by the model checking step, and in act 651 the value of I is set to one. Note that the same cycle count I that was used in analysis act 620 is now used for simulation in act 650. Then, in act 653, stimulus for cycle number I from the model checking step of FIG. 6A is applied to the inputs of the transformed CUV and in act 654 cycle number I of operation of the transformed CUV is simulated. If I is less than a limit set by the variable LI returned from model checking, then I is increased by one and the process is iterated, otherwise the simulate step of FIG. 5A is complete. Note that LI is the cycle in which the model checking method finds the assertion to have been violated.

Figure 4A:
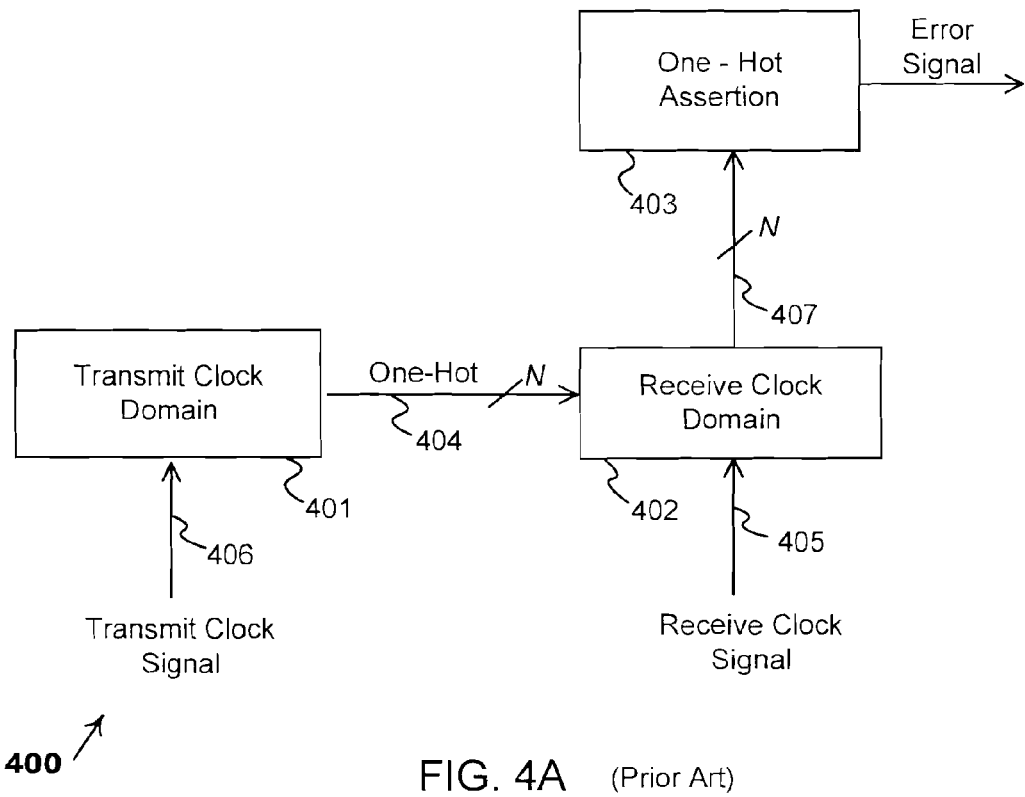
FIG. 4A shows, in a block diagram, an example circuit having N CDC signals and a one-hot assertion.

Performance of method 600 (FIG. 6A) on the example circuit of FIG. 4 is now described for some embodiments of the invention. Although in FIG. 7 the circuitry being inserted is shown by way of drawings, in several embodiments a Verilog description of the circuit under verification ("CUV") shown in Appendix A is transformed by act 610 into the corresponding Verilog description of the transformed CUV in Appendix B (which is also located just before the claims). Note that Appendix B is an integral portion of this detailed description of an embodiment of the invention, and is incorporated by reference herein in its entirety. Note also that in some embodiments, the Verilog description of Appendix A is transformed by act 610 into an internal representation equivalent to the Verilog description of Appendix B.

Figure 4B:
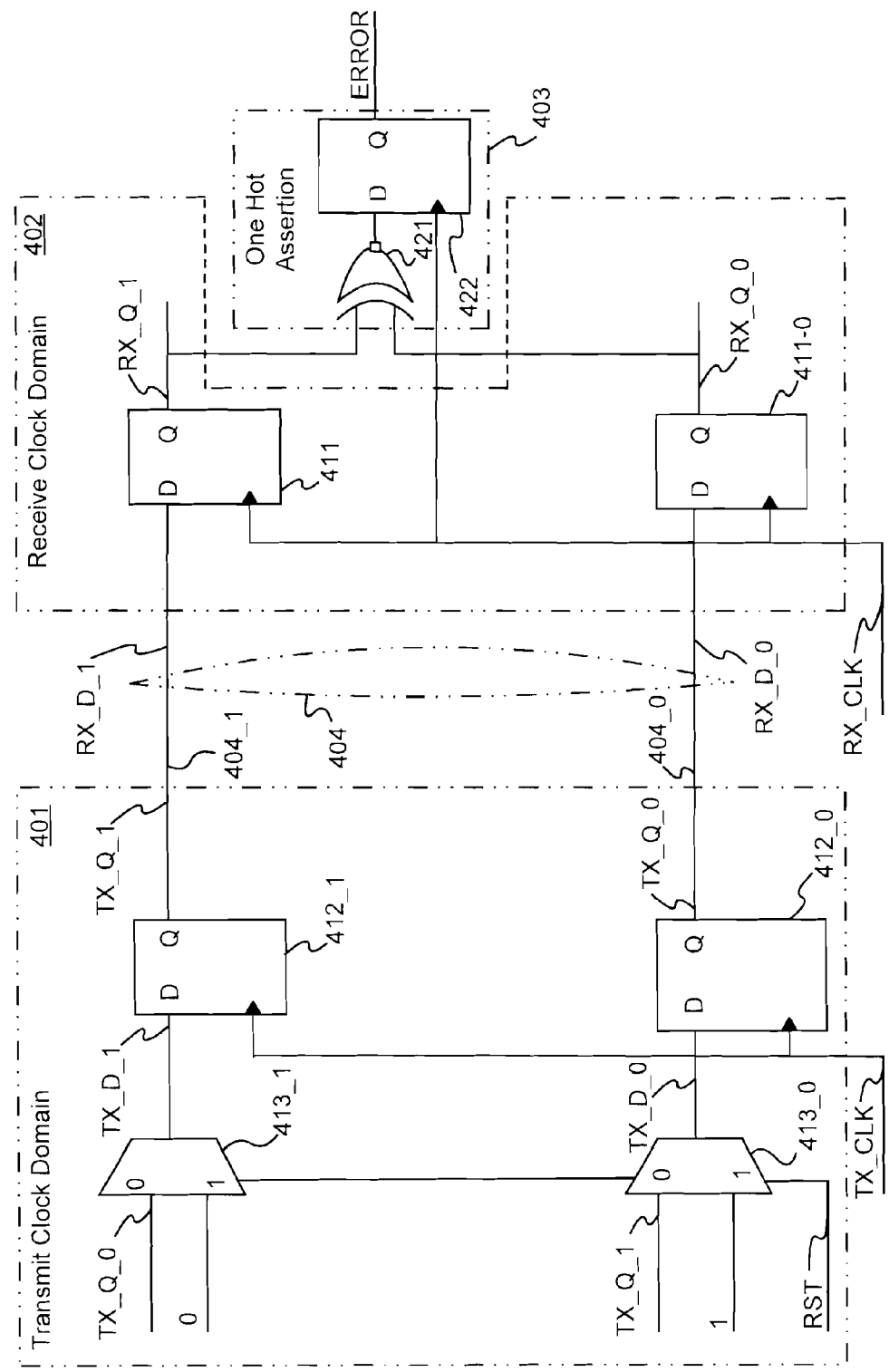
FIG. 4B shows, in a detailed circuit diagram, the circuit of FIG. 4A having tow CDC signals.

In act 610, a first metastability injector 701 (FIG. 7) is inserted in the path of CDC signal RX_D_0 of FIG. 4B, and a second metastability injector 702 (FIG. 7) is inserted in the path of the CDC signal RX_D_1 of FIG. 4B. Specifically, the circuitry in FIG. 4 is changed as follows, starting with circuit description 601. A module for the metastability injector in Verilog is copied and placed into description 601 twice, once for injector 701 and again for injector 702. When adding injectors 701 and 702 into the description 601, signals are appropriately renamed and/or the signal names are used in appropriate places for the injectors to become inserted into the paths of the CDC signals.

For example, whatever the CDC signal names are (such as signal names TX_Q_0 and TX_Q_1) these same names are used as the names of the CDC signal input to the respective injectors 701 and 702 (e.g. in injector 701 name TX_Q_0 may be used at each of (a) multiplexer input, (b) inverter input, and (c) XOR gate input). Moreover, whatever signal names are present at the data input of the transmitting registers (e.g. signal names TX_D_0 and TX_D_1) these names are used as the names of the early CDC signals at the respective injectors 701 and 702 (e.g. signal name TX_D_0 is used as a second input of the XOR gate). Finally, the names of signals that are output by injectors 701 and 702 are used as the signals input to receiving registers RX_REG_0 and RX_REG_1 in receive clock domain 102 (instead of the names of the CDC signals that were originally present in circuit description 601). In Appendix B, there are two new inputs in the transformed circuit description 603 that were not previously present in Appendix A, namely jitter_control_0 and jitter_control_1 which respectively represent two enable signals for the two metastability injectors 701 and 702. Note that one additional input for alignment between the receive and transmit clocks is not used in this embodiment (whose output is shown in Appendix B), although such an additional input is used in other embodiments.

Transformations of the type described in the previous paragraph, to add metastability injectors to a circuit description 601 can be done either directly in the Verilog language, or alternatively the transformations can be done on a schematic which is then translated into Verilog language. Moreover, such transformations can be done automatically in a computer 602 or alternatively the transformations can be done manually.

Note that when there are multiple metastability injectors in a transformed CUV, the enable signal of each metastability injector may be turned on or off independent of the other metastability injectors. Furthermore, even in the case of an "n" bit bus 704 whose signals are all stored in a single "n" bit register in a single device, note that each path for each bit in bus 704 has its own metastability injector, and each metastability injector may be independently enabled (so that each bit in the "n" bit register is made metastable independent of any other bit in the "n" bit register).

In some embodiment of the invention, the Verilog description in Appendix B is analyzed as per act 620 (FIG. 6A) by a computer programmed with a model checking program called "VIS" that is available via the Internet at "www-cad" dot "eecs" dot "berkeley" dot "edu" slash "Respep" slash "Research" slash "vis", wherein the word "dot" should be replaced by "." and the word "slash" is to be replaced by "/" to form the "http" address of a web page at the University of California, Berkeley. Note that the VIS system is also described in an article entitled "VIS: A System for Verification and Synthesis", The VIS Group, In the Proceedings of the 8th International Conference on Computer Aided Verification, p 428-432, Springer Lecture Notes in Computer Science, #1102, Edited by R. Alur and T. Henzinger, New Brunswick, N.J., July 1996, which is incorporated by reference herein in its entirety.

Specifically, the VIS system is used to analyze the transformed CUV in Appendix B to determine stimulus to apply to the inputs of the transformed CUV during simulation of the transformed CUV using a conventional RTL simulator such as VCS or NC Verilog in order to violate the assertion. As described above, violation of the assertion during RTL simulation of the transformed CUV indicates that metastability in the physical CLTV may cause incorrect behavior of the physical CUV.

In order to use the model checking method of the VIS system to determine the stimulus sequence to apply to the inputs of the transformed CUV in order to violate the assertion as per act 620 in FIG. 6A, the Verilog representation of the transformed CUV shown in Appendix B is placed in a file named "translate.v" and provided as input to a sequence of VIS system commands shown below:

vl2mv -c -F translate.v
read_blif_mv translate.mv
flatten_hierarchy
static_order
build_artition_mdds
check_invariant -f -d 1 -i -v 2 invar The sequence of VIS system commands "vl2mv", "read_blif_mv", "flatten_hierarchy", "static_order" and "build_partition_mdds" shown above create an internal representation of the transformed CUV in preparation for model checking. The VIS system command "check_invariant" shown above performs model checking on the internal representation of the transformed CUV. The file "invar" in the VIS system command "check_invariant -f -d 1 -i -v 2 invar" in the above set of commands contains a line "error=0", directing the model checking program of the VIS system to find a counterexample for the invariant "error=0", i.e., to find a counterexample for the one-hot checker in the transformed CUV.

In response to the sequence of commands shown in the previous paragraph, the model checking program of the VIS system produces an output file shown in Appendix C (which is located below, just before the claims). Appendix C forms an integral portion of this detailed description of some embodiments of the invention, and is incorporated by reference herein in its entirety. The output file shown in Appendix C represents the stimulus sequence to apply to the inputs of the transformed CUV during simulation using a conventional RTL simulator such as VCS or NC Verilog, starting from the reset state of the CUV, to violate the invariant "error=0", i.e., to violate the one-hot assertion in the transformed CUV.

Thereafter, as per act 650, the VCS simulator is used to simulate the transformed CUV along with the stimulus sequence shown in Appendix C as input, starting from the reset state of the CUV. In addition, as per act 660, waveforms from the simulation are displayed on a computer screen (shown in FIG. 8), using a waveform viewer such as SimVision from Cadence Design Systems, Inc.

Figure 8:
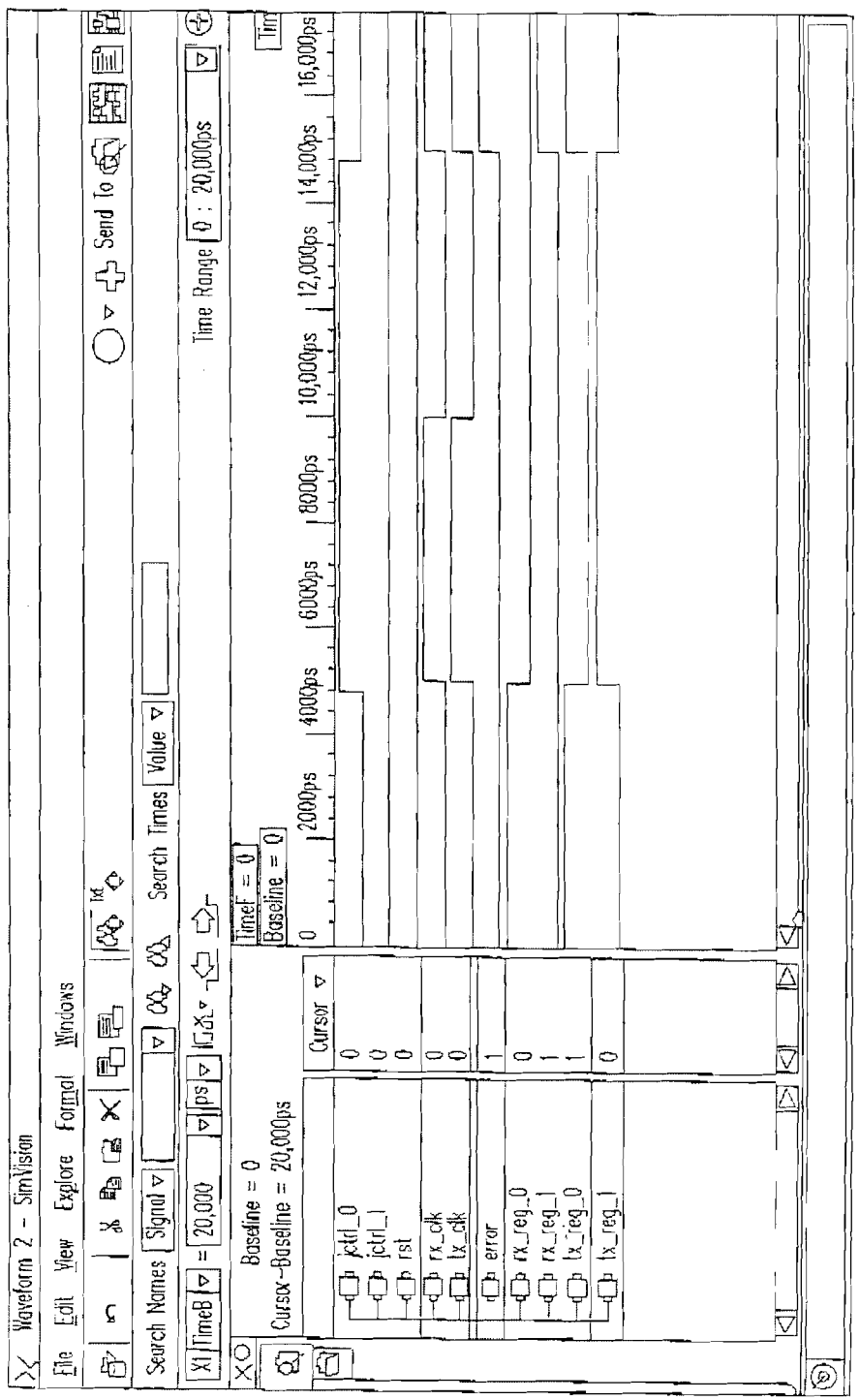
FIG. 8 illustrates a display on a computer screen of waveforms from simulation of a description (in Verilog) of the circuit of FIG. 7 while applying a stimulus sequence in accordance with the invention.

In the simulation waveforms shown in FIG. 8, at time 4800 ps, jitter control input jitter_control_0 of the transformed CUV becomes asserted, modeling the case in which the physical register rx_reg_0 enters the metastable state at the rising edge of rx_clk at time 5000 ps and then settles to the inverse of the logic value that would be produced by conventional RTL simulation of the non-transformed circuit, thus violating the one-hot assertion and causing the error signal to become asserted at time 15000 ps. As described above, violation of the one-hot assertion indicates that metastability in the physical CUV may cause incorrect behavior of the physical CUV.

Figure 7:
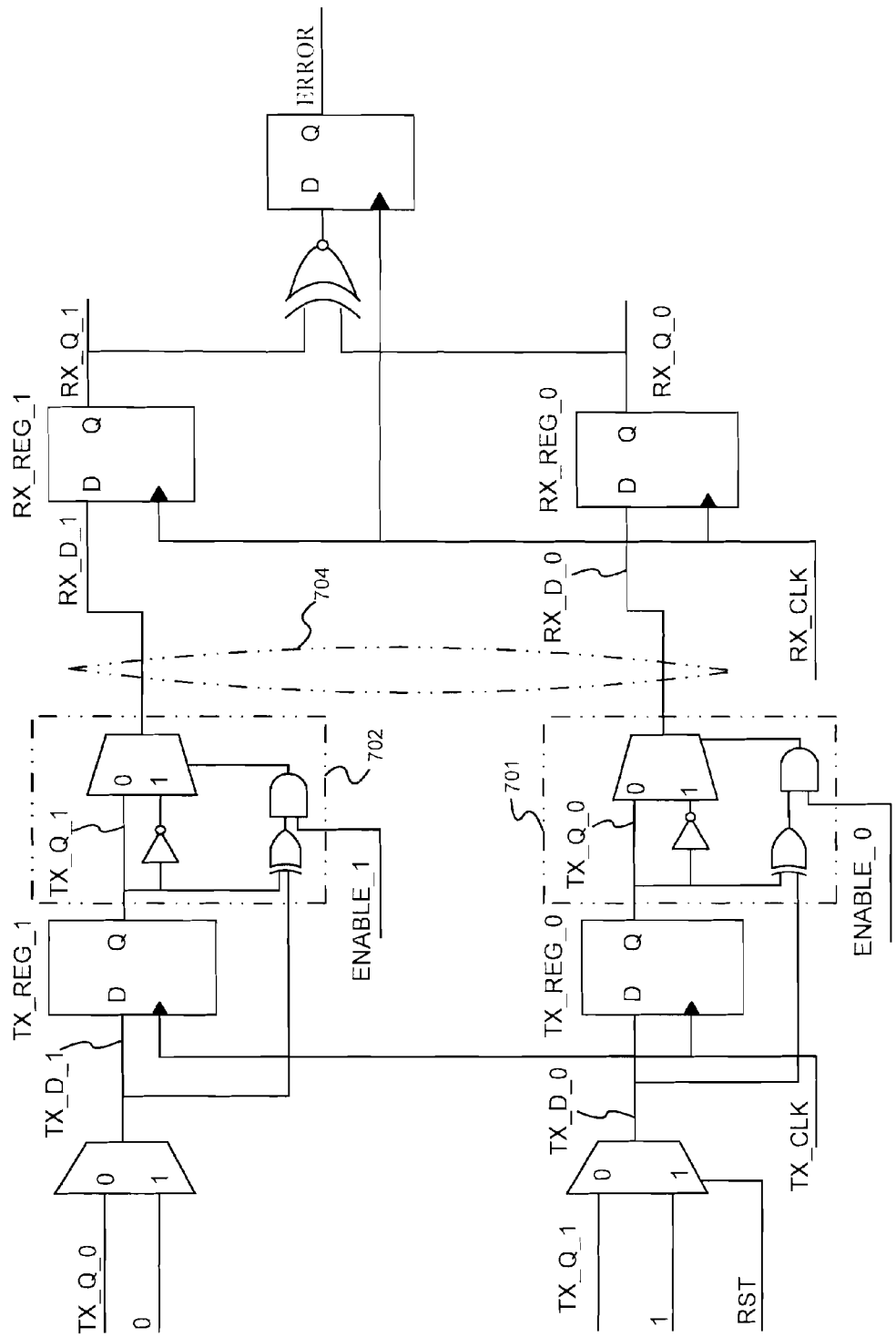
FIG. 7 illustrates a transformed circuit obtained by performing the method of FIG. 6C on the circuit of FIG. 4B.

Although, for illustrative purposes, the example circuit shown in FIG. 7 is small, containing only two clock signals and five registers, the method described above for the example circuit is also applied in the same manner to large circuits, for example, circuits containing hundreds of millions of registers and hundreds of thousands of clock signals. Numerous modifications and adaptations of the embodiments described herein will be apparent to a person of skill in the art of electronic design automation (EDA) in view of this disclosure.

In accordance with an embodiment of the invention, a verification method includes one or more of the following steps: (1) automatically transforming a description of a CUV containing a predetermined assertion that is automatically inferred; (2) automatically transforming a description of a CUV containing a pre-determined assertion that is user-specified; (3) automatically transforming a description of a CUV containing a pre-determined assertion to detect incorrect behavior of the CUV due to metastability of a clock-domain-crossing (CDC) signal; (4) selecting an initial state for use by the model checking method that represents all reachable states of the CUV; (5) using a Verilog representation of the CUV as input to the model checking step; (6) using a VHDL representation of the CUV as input to the model checking step; (7) using a representation of the CUV stored in computer memory as input to the model checking step; (8) using a representation of the CUV stored on disk as input to the model checking step.

Figure 9:
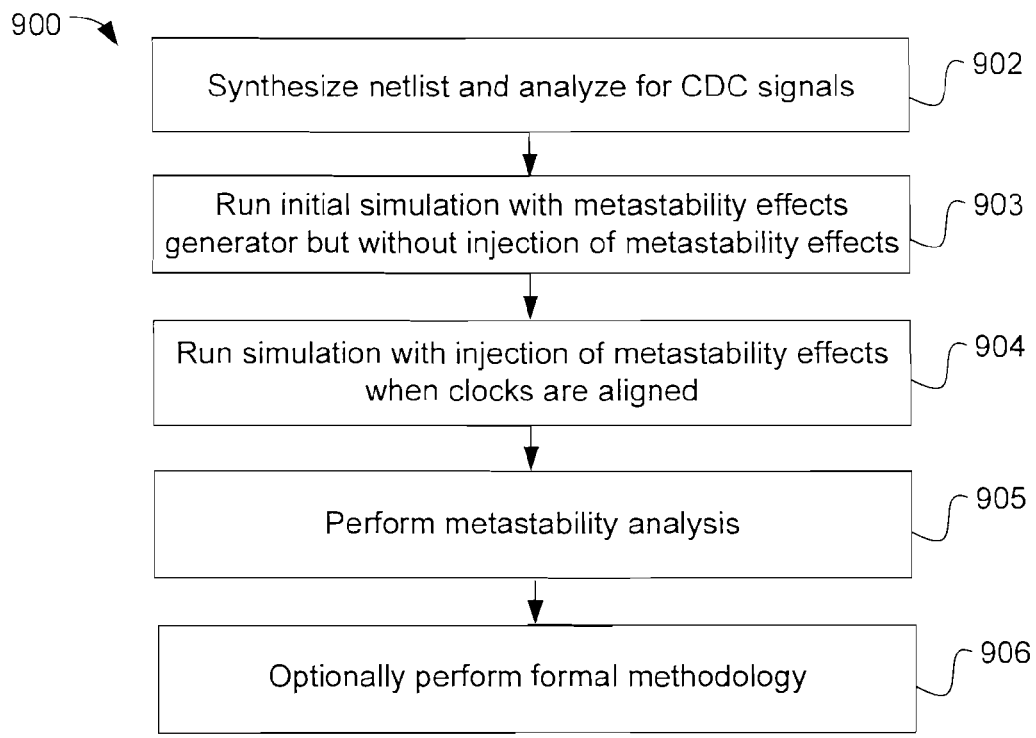
FIG. 9 illustrates a flow diagram of one exemplary implementation of a process for verifying a circuit that includes both a first and second simulation step.

Refer now to FIG. 9, which illustrates a flow diagram of one exemplary process 900 for verifying an integrated circuit in accordance with the present invention. This process systematically verifies circuit designs by accurately modeling the effects of metastability during RTL simulation. With process 900, circuit designers are able to use RTL simulation to verify, before implementing a circuit design in hardware, that the proper functioning of the hardware circuit will not be affected by metastability in registers that receive CDC signals.

As an initial step 902, a programmed computer uses an RTL description of the circuit under verification (CUV) to identify each clock domain and each CDC signal. Step 902 includes the steps of automatically synthesizing the RTL description into an internal netlist and then automatically analyzing the resulting netlist to identify and report nodes where CDC signals exist. Both the sequential logic element that generates the CDC signal, referred to herein as the transmitting register, and the sequential logic element that receives the CDC signal as an input, referred to as the receiving register, may be one of several different kinds of sequential logic elements such as a random-access memory cell, or a D, T, J-K or R-S flip-flop. In its path from the transmitting register to the receiving register, the CDC signal may traverse various types of combinational logic elements, such as inverters, "and" gates, "or" gates and multiplexers.

During step 902, the various clocks in the circuit description are grouped so that all clocks within a given group are synchronous. This clock grouping information may be determined automatically or may be provided by the circuit designer. The clock grouping information is automatically propagated through the netlist to identify domains of the circuit such that all sequential logic elements in a single domain have clocks in the same clock group. Once the clock domains of the circuit are identified, signal paths are automatically analyzed to identify CDC signal paths that originate in a transmitting register in one clock domain and are used in the combinational fan-in of a receiving register in another clock domain. A CDC signal path could lead to metastability in the receiving register. In a preferred embodiment, the 0-In CDC tool, which is marketed by Mentor Graphics, the assignee of the present invention, identifies the CDC signal paths.

The circuit designer may exclude certain CDC signals from further analysis based on knowledge acquired during previous iterations of process 900 or from other general knowledge of the circuit. In other instances, specific CDC signals may be omitted from further analysis so that attention may be focused on other, more critical parts of the circuit.

Once the CDC signals and the corresponding receiving registers are identified, a metastability effects generator is automatically generated for each register that receives a CDC signal and an initial simulation test is run as indicated in step 903, including all the metastability effects generators. In a preferred embodiment, metastability generators are expressed in Verilog or VHDL and are written out in text format to a file so that they can be examined and modified by the circuit designer. In alternative embodiments, metastability generators may be expressed in other formats useful for describing circuit designs. In still other embodiments, metastability generators may be stored as data structures in a computer memory for subsequent use by a simulator.

An initial simulation test is run with a CDC coverage monitor included in each metastability effects generator to monitor the corresponding CDC signal, counting the number of times that metastability of the receiving register would be possible in hardware and collecting other measures of the effectiveness of the simulation test for verifying the effects of metastability. In one embodiment, the initial simulation test is run using a conventional RTL simulator such as VCS, provided by Synopsys, Verilog N.C., provided by Cadence Design Systems, or ModelSim, provided by Mentor Graphics.

Preferably, the initial simulation test is run without the injection of metastability effects, as indicated at step 903, because it is important to verify that the logical behavior of the circuit design is correct in the absence of metastability effects. During the initial simulation test, metastability effects generators are used to collect statistics for each CDC signal. In general, metastability of the receiving register may occur whenever the CDC signal at the data input of the receiving register is changing and the active edges of the respective TCD clock and the RCD clock are aligned in such a way that the change on the data input of the receiving register may violate a setup or hold time parameter of the receiving register. The present invention measures the number of times the data input of the receiving register changes during simulation. Further, the present invention measures the number of times the TCD clock and the RCD clock are aligned. Further still, the present invention measures the number of times the active edge of the TCD clock follows the active edge of the RCD clock and the number of times the active edge of the RCD clock follows the active edge of the TCD clock.

The coverage statistics, obtained in step 903, identify deficiencies in the simulation test. A report may be automatically generated summarizing these deficiencies for the circuit designer. For example, if the count of the number of times that the TCD and RCD clocks are aligned and the active edge of the TCD clock follows the active edge of the RCD clock is too low, then the simulation test can be modified to make the count higher. Such modifications will make the simulation more strenuous and stress the circuit design during subsequent simulations that include metastability effects injection.

Once the results obtained in step 903 indicate that the circuit design functions correctly and that the coverage statistics indicate that the simulation test is adequate for verifying the effects of metastability, a second simulation test is run, as indicated in step 904. In one embodiment, the second simulation test is run using a conventional RTL simulator such as VCS, provided by Synopsys, Verilog NC, provided by Cadence Design Systems, or ModelSim, provided by Mentor Graphics. During the second simulation test, metastability effects are pseudo-randomly injected ("forced") onto the output of each register receiving a CDC signal by a metastability effects generator circuit that pseudo-randomly either inverts or does not invert the logic value of each receiving register's output. It is preferable to delay the forcing of the output by at least one "tick" where a tick corresponds to the minimum time unit used by the simulator. In other simulations, the forcing may be delayed by an amount of time equal to the clock-to-Q delay of the receiving register. In still other simulations, the forcing may be delayed by an amount of time specified by the user, e.g., 1 nanosecond. By delaying the forcing on the output of the register, the present invention can generate glitches on the output of the receiving register to approximate the transient effects of metastability as observed in hardware.

This simulation in step 904 combines pre-existing simulation tests with the injection of metastability effects. It is important to note that a given metastability injector will inject metastability effects onto the output of a register receiving a CDC signal only at "appropriate times" during the simulation. The phrase "appropriate times" means those times during the simulation when the active edges of the TCD clock and the RCD clock are aligned and the CDC signal at the data input of the receiving register is changing. The word "aligned" is used to denote the timing condition where the active edges of the TCD clock and the RCD clock are close enough in simulated time that the CDC signal at the data input of the receiving register might change during the setup or hold time of the receiving register.

In one embodiment, the user may specify a window of time around the active edge of the RCD clock to define when the clocks are aligned. A command is used to automatically generate Verilog clock-alignment detectors from two user-specified constants. These two constants define a window of time relative to the active edge of a specific RCD clock for CDC signals originating from a specific TCD. A separate window may be defined for each distinct pair of RCD and TCD. When the active clock edge of the TCD clock occurs during this defined window and the CDC signal is changing at the data input of the receiving register, then the metastability effects generator associated with the CDC signal is enabled to inject metastability onto the output of the receiving register. However, if the active edge of the TCD clock occurs outside of this window or if the CDC signal is not changing at the data input of the receiving register, then the receiving register cannot become metastable and no metastability injection is enabled.

Reports of coverage statistics related to metastability injection, along with other reports produced by the simulation run, are generated in step 905 and displayed for the circuit designer.

Coverage statistics preferably include a variety of measured parameters and test results obtained by running the simulation. It will be understood that a report of the test conditions applied to the circuit design will assist the circuit designer by providing vital information about how the circuit responded to the various test conditions, what metastability effects were injected, and whether the testbench provided adequate stimulus that afforded opportunities to inject metastability effects. Preferably, the coverage statistics that are acquired and reported include separate statistics for each CDC signal and include information showing when and how many times the CDC signal at the data input of the receiving register changed state (referred to as "is changing") and when the T CD and RCD clocks were aligned (referred to as "is aligned"). Other statistics that are preferably acquired and reported include when and how often an "is changing" indication occurs simultaneously with an "is aligned" indication. The number of times when the CDC signal at the data input of the receiving register is changing and the clocks are aligned represents the number of opportunities when metastability effects may be injected during the simulation.

To illustrate, if a CDC signal changes state only a few times during a simulation and it changes state when the TCD and RCD clocks are aligned for only a small fraction of those times, then coverage is poor and additional tests need to be added to the test suite so that there are more state changes when the clocks are aligned. Similarly, if a CDC signal changes state often but only rarely when the TCD and RCD clocks are aligned, then additional tests need to be added to the test suite.

Preferably, metastability effects are pseudo-randomly injected. Therefore, it is desirable to identify how many times metastability effects are actually injected during the simulation test. It is preferable that a simulation test provides a high number of opportunities for injection of metastability effects and that a high percentage of these opportunities actually have metastability effects injected and that the results of the simulation test indicate correct operation of the CUV. When this occurs, the circuit designer will have a high degree of comfort that the circuit was adequately stressed and still continued to function correctly. It is important to note that while the injection of metastability effects preferably occurs on a pseudo-random basis, injection only occurs when conditions that can give rise to actual hardware metastability are satisfied. That is, metastability is injected only when the CDC signal at the data input of the receiving register is changing and the TCD and RCD clocks are aligned.

Figure 2A:
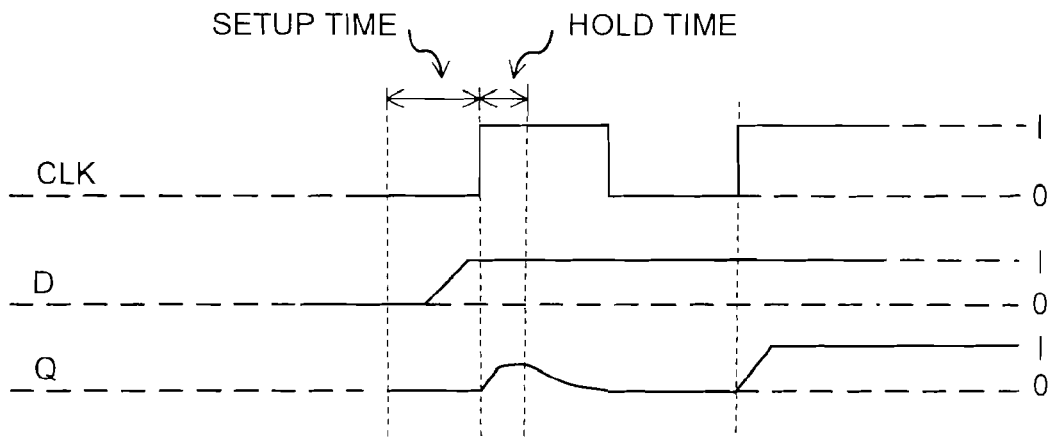
FIG. 2A shows representative electrical waveforms for physical register 111 of FIG. 1B showing violation of the setup-time parameter followed by the Q output entering the metastable state followed by the Q output settling to the incorrect logic value.
Figure 2B:
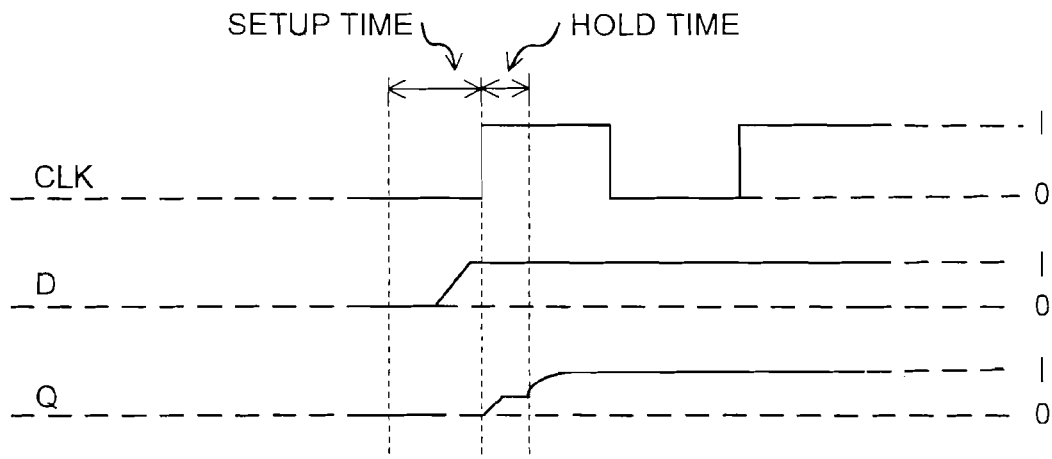
FIG. 2B shows representative electrical waveforms for physical register 111 of FIG. 1B showing violation of the setup-time parameter followed by the Q output entering the metastable state followed by the Q output settling to the correct logic value.
Figure 2C:
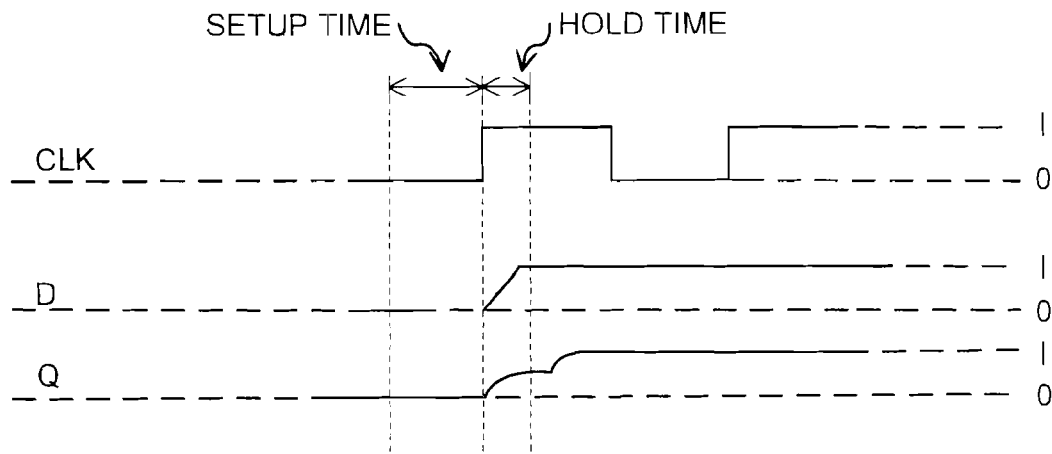
FIG. 2C shows representative electrical waveforms for physical register 111 of FIG. 1B showing violation of the hold-time parameter followed by the Q output entering the metastable state followed by the Q output settling to the incorrect logic value.
Figure 2D:
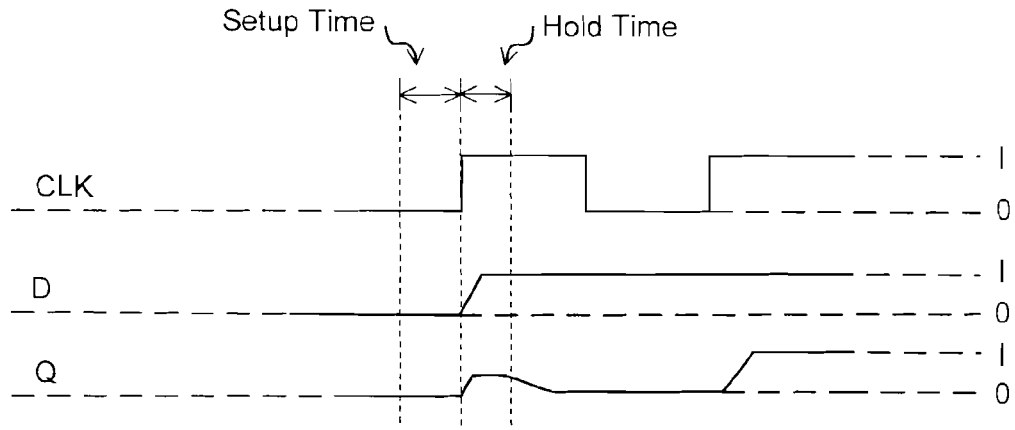
FIG. 2D shows representative electrical waveforms for physical register 111 of FIG. 1B showing violation of the hold-time parameter followed by the Q output entering the metastable state followed by the Q output settling to the correct logic value.
Figure 3A:
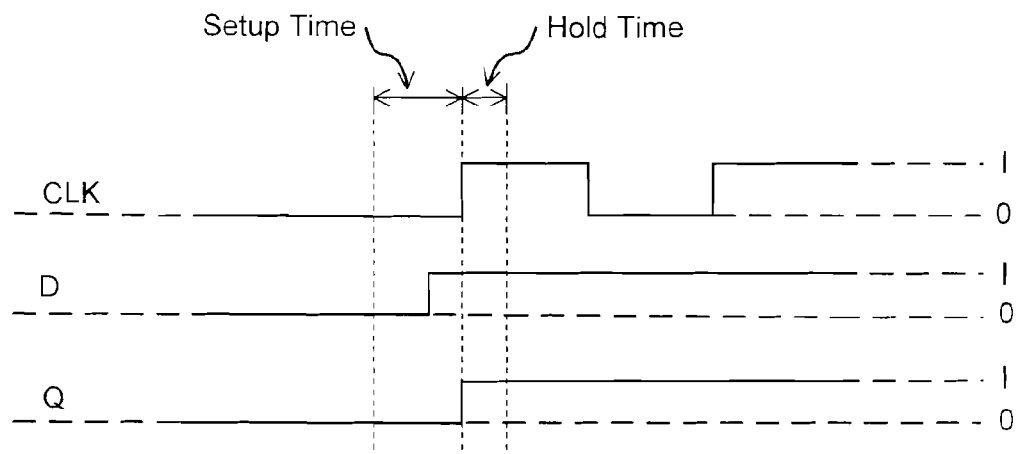
FIG. 3A shows simulation waveforms from conventional RTL simulation of a model of register 111 of FIG. 1B showing violation of the setup-time parameter and the resulting Q output produced.
Figure 3B:
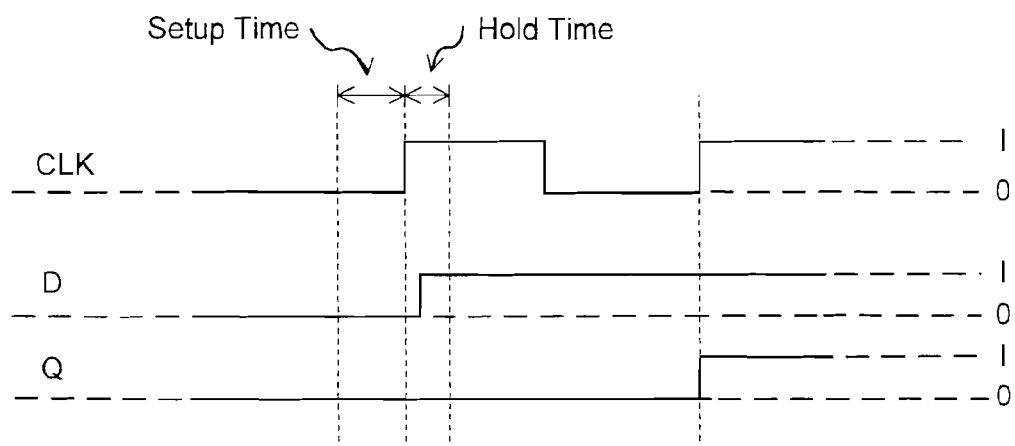
FIG. 3B shows simulation waveforms from conventional RTL simulation of a model of register 111 of FIG. 1B showing violation of the hold-time parameter and the resulting Q output produced.

While knowledge of the overall number of times that metastability is injected during the simulation is important, additional statistics are very useful in determining the cause of the failure. Another statistic that is acquired and reported with the present invention during the simulation test is the number of times that metastability injection caused a transition to be delayed at the output of the receiving register. This condition is illustrated in FIGS. 2A and 2B where the CDC signal (the D input) changes during the setup time window. Still another statistic that is acquired and reported is the number times that metastability injection caused a transition to be advanced at the output of the receiving register. This condition is illustrated in FIGS. 2C and 2D where the CDC signal (the D input) changes during the hold time window.

In addition to collecting and reporting these statistics, an embodiment of the present invention provides for immediately flagging an error when an error detector (also referred to herein as "assertion" or "checker") detects a pre-determined error condition during a simulation test. Thus, a human viewable indicator is generated and transmitted for viewing when injection of metastability results in a pre-determined error condition. Further, in addition to the above noted statistics, additional types of error detectors are contemplated in yet other embodiments. To illustrate: 1) an error detector asserts an error whenever the receiving register has the potential to become metastable (i.e., whenever the TCD and RCD clocks are aligned and the CDC signal at the data input of the receiving register is changing); 2) an error detector asserts an error whenever a glitch on the data input of the receiving register has the potential to be stretched into a full-cycle pulse at the output of the receiving register due to the TCD and RCD clocks being aligned; and 3) an error detector asserts an error whenever a one-cycle pulse on a CDC signal input to synchronizer logic in the RCD has the potential to be eliminated at the output due to metastability. One skilled in the art will understand that additional error detectors may be apparent for a particular application. These error detectors are particularly useful in locating errors associated with protocols for transmitting data across clock domains ("CDC protocols") that would not be identified using conventional RTL simulation.

Unlike the formal verification methodology, as described above in conjunction with FIGS. 5-8, where the formal model of the circuit description is transformed to include metastability injectors, the present invention does not require modification of the original circuit description or simulation test. It is of considerable advantage that, in accordance with a preferred embodiment of the present invention, the simulator combines an internal representation of the original RTL circuit description file with an internal representation of the automatically generated metastability effects generators file to provide a mechanism for verifying the effects of metastability.

If the circuit design is tolerant of metastability effects, then every pre-existing simulation test that passed previously should continue to pass even with the added stress of the injection of metastability effects. However, if a simulation test fails with metastability injection enabled, then the circuit design is susceptible to failure when implemented in hardware. Since many registers may be metastable in a failing simulation test, it is often difficult to determine which register is the root cause of the failure. To narrow down the root cause, all but a selected set of metastability effects generators may be removed or disabled and the simulation may be re-run in an iterative fashion. In one embodiment, the metastability effects generators are disabled using a command line interface. Alternatively, as indicated at step 906, a formal methodology may be used, thereby affording greater control and visibility of the injectors that will allow the source of the error to be more readily diagnosed. In order to use a formal methodology, assertions (also referred to herein as "error detectors" or "checkers") must be added to the circuit description to detect incorrect operation of the circuit.

Figure 10:
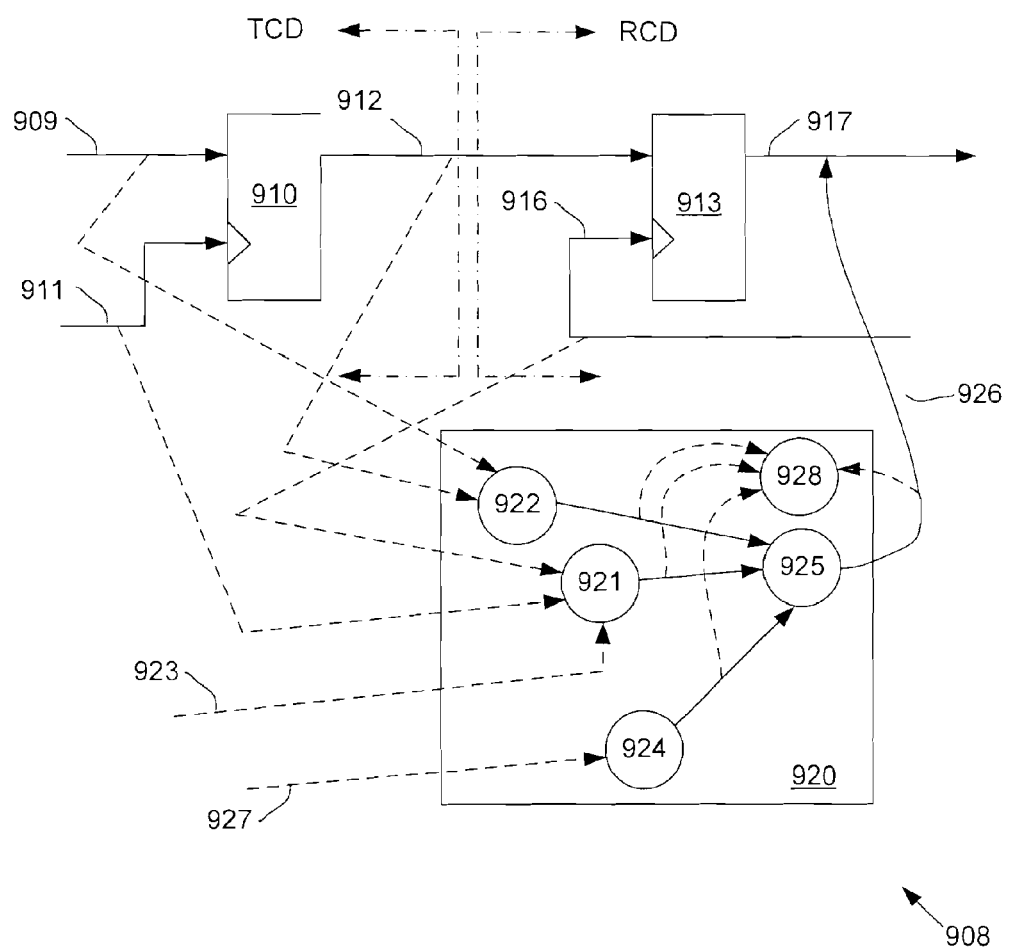
FIG. 10 illustrates a metastability effects generator circuit that provides pseudo-random injection of metastability effects in a circuit design during a simulation test accordance with an embodiment of the present invention.

FIG. 10 illustrates a circuit 908 including a metastability effects generator 920 that pseudo-randomly injects metastability effects onto a particular node in a circuit design during a simulation test. It is to be understood that many such nodes are typically present in a complex circuit design that uses multiple asynchronous clocks. In circuit 908, the transmitting register is a register 910 in the TCD. Register 910 has data input 909 that may be driven by a cone of logic (not shown). It will be appreciated that this cone of logic may comprise many combinational and sequential logic elements that determine the value of the data input 909. In one embodiment, the present invention synthesizes a netlist comprising the cone of logic driving the data input 909 and the cone of logic driving the data input of the receiving register 913. From the netlist, a logic expression, e.g., a Verilog or VHDL expression, is inferred that determines when the CDC signal will change value at the data input of the receiving register 913.

A TCD clock 911 is also applied to transmitting register 910. The output of transmitting register 910 is CDC signal 912 that crosses from the TCD to the RCD and is received by receiving register 913 Register 913 is clocked by RCD clock 916. Although both registers 910 and 913 are shown as D-type flip-flops, it is to be understood that either or both registers may comprise any type of sequential logic element.

Under certain test or operating conditions, the combination of the value on data input 909 and an active clock edge on TCD clock 911 may cause the CDC signal 912 to change at the data input of register 913 almost simultaneously with the active edge of RCD clock 916. In hardware, this condition may cause metastability on output 917 of register 913, thereby creating the possibility that the hardware circuit will not function in the manner predicted by conventional RTL simulation. To correctly simulate the effects of metastability, metastability effects generator 920 forces metastability onto signal 917, thus providing an opportunity to debug the response of the circuit design to metastability using preexisting simulation tests run by a conventional RTL simulator. The metastability injection occurs only when the CDC signal 912 is changing at the data input of receiving register 913 and the active edges of the TCD and RCD clocks are aligned.

Metastability effects generator 920 is a circuit description, e.g., expressed in Verilog or VHDL, associated with a particular receiving register 913 identified during analysis 902 (FIG. 9). In analysis step 902, a separate metastability effects generator is automatically generated for each sequential logic element that receives a CDC signal, including each separate bit of each multi-bit sequential logic element. The circuit designer may add, remove, enable or disable metastability effects generators before running a simulation test. Furthermore, metastability effects generators may be manually associated with selected registers. It is preferable that such manually associated metastability effects generators are included inside synchronizer module definitions so that they are automatically instantiated together with the corresponding synchronizers. Preferably, any automatically generated metastability effects generator that is redundant (for example, identical to a manually specified metastability effects generator) is automatically removed or disabled prior to simulation.

In a preferred embodiment, the metastability effects generator file is separate and independent from other simulation and circuit description files, thus, it may be readily inspected and the metastability effects generators included in the file may be selectively removed, added, enabled or disabled. In other embodiments, metastability effects generators may be represented using data structures in computer memory that are accessed directly by the simulator.

During simulation, metastability effects generator 920 monitors clocks 911 and 916 at detector 921 to detect when the active clock edges are aligned. The "is aligned" signal generated by detector 921 is computed by acquiring and comparing the times of the clock edges. For example, the clock edges may be considered aligned if the separation between the clock edges is less than 100 picoseconds. Alternatively, detector 921 generates the "is aligned" signal if TCD clock 911 has an active edge that occurs during a specified window defined relative to the active edge of the RCD clock 916. Detection of clock edge alignment is critical to the accurate injection of metastability and the elimination of false errors that might occur if metastability were injected when the clocks were not aligned.

It will be appreciated that while one CDC signal is shown for clock pair 911 and 916, it is possible that in a particular circuit design a single clock pair may control hundreds or even thousands of CDC signals. Thus, a single clock-alignment detector 921 may be associated with multiple CDC signals.

Figure 11:
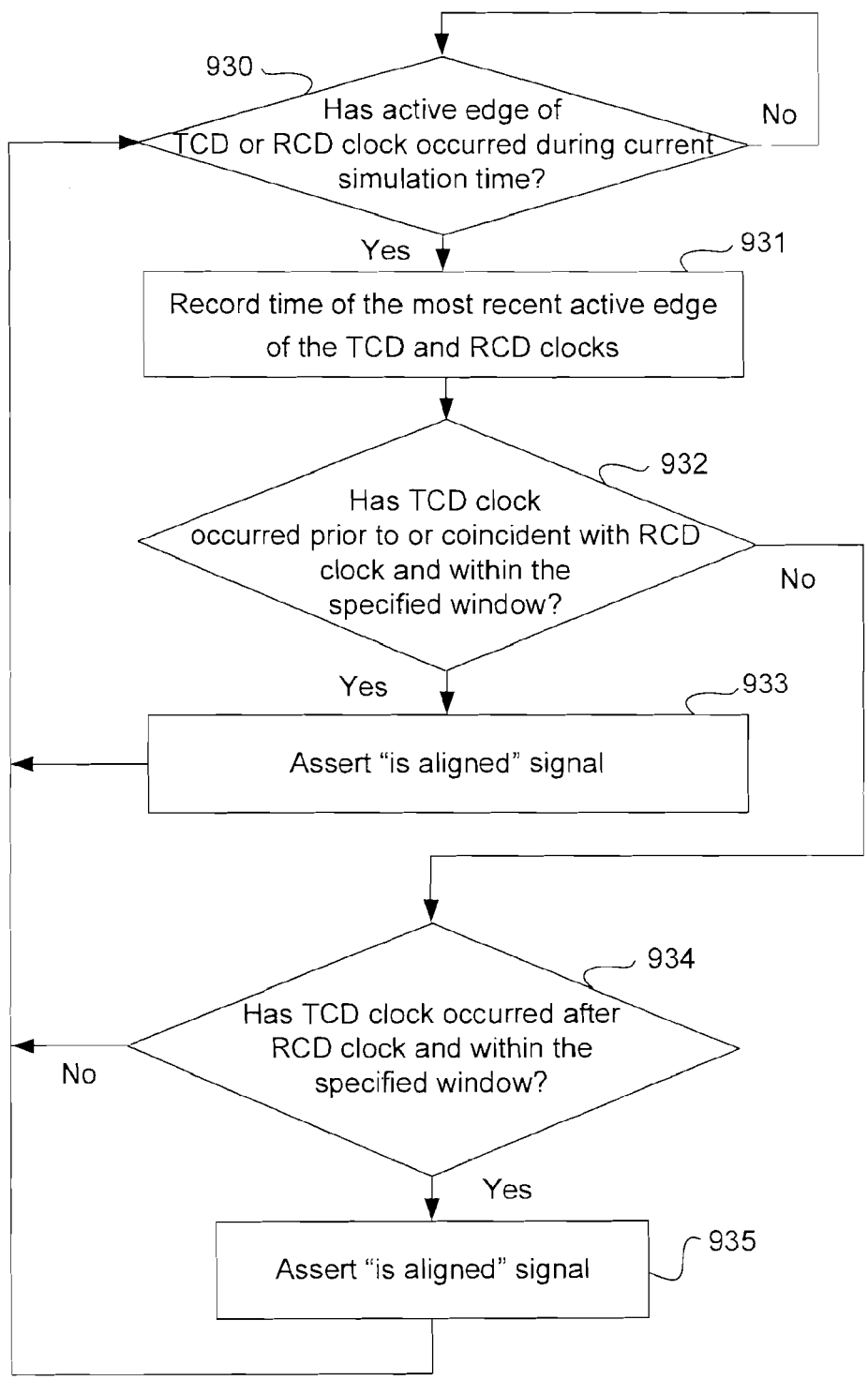
FIG. 11 illustrates operation of a clock alignment detector in accordance with an embodiment of the present invention.

Preferably, a separate clock-alignment detector detects alignment of each pair of clock domains detected in analysis step 902. As shown in FIG. 11, the clock alignment detector for a particular clock domain pair operates in the following manner. In step 930, if an active edge of either the TCD or RCD clock is detected at the current simulation time, then the process proceeds to step 931, otherwise the process loops at step 930 until an active edge of either the TCD or RCD clock is detected. In step 931, the time of the most recent active edges of the TCD and the RCD clock are recorded. In step 932, a determination is made as to whether the most recent active edge of the TCD clock occurred within a specified window and prior to or coincident with the active edge of the RCD clock. If so, then the setup time of the RCD clock is violated and the "is aligned" signal is asserted, as indicated in step 933. The process then proceeds from step 933 back to step 930 to detect the next active clock edge of either the TCD or RCD clock. If the test in step 932 fails, the process proceeds from step 932 to step 934.

Similarly, in step 934, a determination is made as to whether the most recent active edge of the TCD clock occurred after the active edge of the RCD clock and within a specified window. If so, then the hold time of the RCD clock is violated and the "is aligned" signal is asserted, as indicated in step 935. In one embodiment, the "is aligned" signal of steps 933 and 935 are asserted after an appropriate delay.

Refer again to FIG. 10. Because the circuit designer may need to overstress the circuit design, input 923 provides a mechanism for the circuit designer to specify the duration of the specified window and the alignment of the window relative to the active edge of the RCD clock. In one embodiment, this window corresponds to the actual setup time and hold time of the hardware receiving register. In another embodiment, the window is selectively modified to overstress the circuit design. For example, the window may be extended to increase the setup time by a selected amount such as 25% of the period of the RCD clock 916, while the hold time portion of the window may be extended by a selected amount such as 5% of the RCD clock period. It is to be understood that other selected amounts are feasible and the circuit designer may separately specify a window for each particular pair of clock domains within a particular circuit design. This increasing or stretching of the window effectively increases the probability that metastability will be injected during the simulation test and thus increases the probability that the simulation test with metastability injection enabled will detect incorrect circuit operation caused by metastability.

Using input 923, the circuit designer may selectively adjust the window of time during which the output of detector 921 will assert an "is aligned" signal (i.e., the "setup-hold window"). Input 923 maps to user-specified values for a particular pair of clock domains. Thus, the circuit designer may easily configure metastability effects generator 920 to change the duration of the setup-hold window for the clock-domain pair defined by TCD clock 911 and RCD clock 916.

Figure 12:
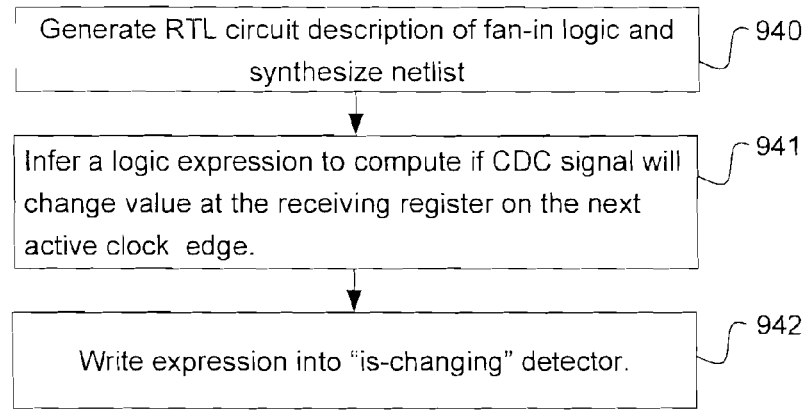
FIG. 12 illustrates operation of an "is changing" detector in accordance with an embodiment of the present invention.

Refer now to FIG. 12, in conjunction with FIG. 10, where the process for determining whether the data input to register 913 is changing is described in more detail. Specifically, as indicated at step 940, determining whether the CDC signal is changing preferably uses an automatically synthesized netlist to identify the cone of logic that fans into data input 909 and the cone of logic that fans into the data input of register 913. The phrase "cone of logic" refers to the sequential and combinational logic that determines the value of the node. The netlist for the circuit is used in step 941 to automatically infer a logic expression to compute whether the data input of register 913 will change on the next active edge of clock 911. The resulting "is changing" logic expression may comprise the cone of logic of the data input of register 913 as well as the cone of logic of input 909. Thus, detector 922 monitors both input 909 and CDC signal 912. The "is changing" logic expression may be expressed, for example, in Verilog or VHDL and is written into detector 922, as indicated at step 942, for use during simulation.

In a preferred embodiment, randomizer 924 pseudo-randomly produces 0 and 1 values based on a seed value that is applied to input 927. If the pseudo-random value produced by randomizer 924 is a 1 and both detectors 921 and 922 are true, signifying that the CDC signal 912 at the data input of register 913 is destined to change value at the next active edge of TCD clock 911, and that clocks 911 and 916 are aligned, then after delay of at least one 'tick' after the next active edge of RCD clock 916, metastability injector 925 forces a value onto signal 917 (for example, by using the Verilog "force" statement) that is the inversion of the value stored in register 913. Otherwise, if the pseudo-random value produced by randomizer 924 is a 0, then metastability injector 925 refrains from forcing any value onto signal 917.

In other embodiments, metastability injector 925 forces pseudo-random 0 and 1 values onto signal 917 regardless of the value stored in register 913. In still other embodiments, the times at which metastability is injected is determined by a non-pseudo-random algorithm. For example, the algorithm may allow the injection of metastability once in every ten opportunities or once in every N opportunities, where N is any positive integer. In still other embodiments, metastability is injected after a delay different from one 'tick', so that the output initially assumes the correct value and then transitions to the forced value.

In accordance with the present invention, circuit analysis of the netlist detects where CDC signals occur, the TCD in which the CDC signal originates and the RCD in which the CDC signal terminates. The respective clock for each domain is also identified. As the RTL simulation is run, metastability effects generator 920 monitors the TCD and RCD clocks to determine whether the active edges of the TCD and RCD clocks are aligned so that metastability might occur. When the clock edges are aligned and the CDC signal 912 changes at the data input of register 913, metastability effects generator 920 pseudo-randomly forces the effects of metastability onto signal 917. Coverage monitor 928 monitors the "is aligned" output of detector 921, the "is changing" output of detector 922, and the output of randomizer 924. The information collected by coverage monitor 928 may be used to display statistics reports during simulation and to generate a statistics report at the end of the simulation run.

In a preferred embodiment, metastability effects are pseudo-randomly injected by inverting signal 917 in response to a seed value present on input 927. Pseudo-random inversion of signal 917 models the case in which output 917 of register 913 becomes metastable and then unpredictably settles to 0 or 1. The combination of pseudo-random inversion of signal 917 with simulation of a pre-existing simulation test suite enables the designer to evaluate whether the circuit design will operate correctly when implemented in hardware and subjected the effects of actual hardware metastability. Since metastability effects are injected into the simulation only when metastability is actually possible in hardware, the present invention produces no false errors.

Preferably, since metastability can be caused by the timing of either data or clock-enable relative to the RCD clock, the data and clock-enable inputs of the receiving register are treated identically. Thus, a metastability effects generator is automatically generated for each sequential logic element that contains a CDC signal in the combinational fan-in of either data or clock-enable.

It is of considerable advantage of the present invention that neither the original RTL design files nor other pre-existing simulation files are modified. Rather, a separate file is automatically generated containing a metastability effects generator 920 for each node where metastability will potentially be injected. The separate file containing the metastability effects generators is then appended to the pre-existing simulation files during the subsequent simulation test. During simulation set-up, the simulator reads the original RTL design files, any other pre-existing simulation files, and a separate file containing the metastability effects generators to construct in computer memory a representation of a combined circuit including the metastability effects generators.

Because the metastability effects generators are included in a separate file, it is possible to add, remove, enable or disable any metastability effects generator before simulation. Similarly, it is possible to manually associate a metastability effects generator with a selected register or to include a metastability effects generator inside a synchronizer module definition.

During simulation, metastability effects generator 920 detects alignment of TCD clock 911 with RCD clock 916, detects changes on CDC signal 912 and forces values onto signal 917. This activity is recorded by coverage monitor 928 which monitors outputs of detectors 921 and 922 as well as the value produced by randomizer 924 during simulation. In a preferred embodiment, signal 917 is forced after a short delay following the active edge of the RCD clock. Thus, signal 917 may glitch by changing immediately after the active edge of the RCD clock to an initial value (the value of signal 917 without forcing, also called the "correct" value) but then settling after a short delay to the opposite value (the forced value). Thus, the present invention allows the simulator to simulate glitches on simulated metastable signals, mimicking real glitches observed on metastable registers in hardware.

Simulating glitches on metastable signals allows detection of additional errors in the CUV, for example, errors related to glitches on inputs to combinational logic that were assumed by the circuit designer to be glitch free. Furthermore, simulating glitches on metastable signals allows the user to detect when metastability was injected by simply examining the waveforms produced by the simulator.

A further advantage of the present invention is that it independently injects metastability onto each bit in a multi-bit register to mimic more closely an actual hardware implementation.

Figure 13:
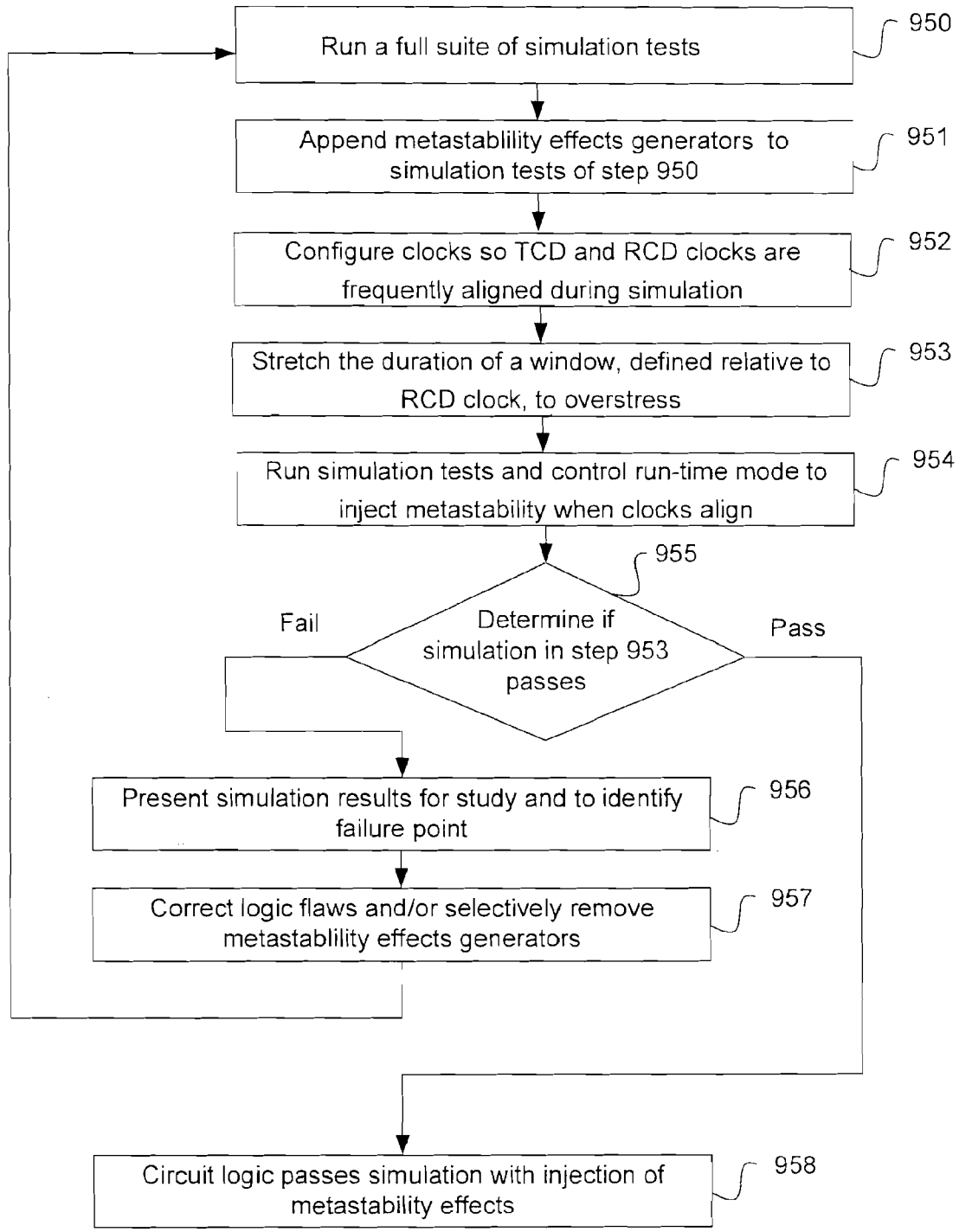
FIG. 13 illustrates a flow diagram of one exemplary implementation of a process for simulating a circuit with metastability effects injection and diagnosing resulting simulation test failures.

FIG. 13 illustrates a method for debugging a circuit design in accordance with one embodiment of the present invention. First, a full suite of simulation tests is run to ensure that the circuit design is functionally correct as indicated at step 950. After the circuit design passes the full suite of simulation tests, metastability effects generators are appended to the pre-existing simulation files, as indicated at step 951. To ensure that there are adequate opportunities to inject metastability it is preferred that the clocks are configured so that TCD and RCD active clock edges will be frequently aligned during subsequent simulations, as indicated at 952.

It is preferred that the simulated RCD and TCD clocks be configured such that each pair of TCD-RCD clocks is aligned to create many opportunities for metastability to occur (i.e., "frequently aligned"). One preferred simulation technique is to run the simulation with fixed clock alignments such that every active edge of the TCD clock violates the setup-hold window of an active edge of the RCD clock. In an alternative embodiment, the simulation is run with the frequencies of the transmit and receive clocks configured such that the active edge of the RCD clock will sweep slowly past the active edge of the TCD clock to test for both setup and hold violations. Further, as indicated in step 953, it may be desirable to stretch a specified window of time around the active edge of the RCD clock that defines when the TCD clock is aligned with the RCD clock. Stretching the window increases the frequency of clock alignment, thus increasing the opportunities for metastability injection, increasing the probability that design errors related to metastability will be detected during simulation and overstressing the circuit design.

Verilog signals that are set and reset by Verilog PLI calls are preferably used to control the run-time mode and selectively pseudo-randomly invert, always invert or never invert metastable signals as indicated at step 954. Thus, depending on the actions of the Verilog PLI calls, each register receiving a changing CDC signal will pseudo-randomly, always or never be inverted when an active edge of the TCD clock occurs within the specified window with respect to an active edge of the RCD clock.

If a simulation test that includes a metastability effects generator fails as indicated at step 955, then there is a design error in the circuit design. Since the circuit design previously passed the simulation test without any metastability effects generators included, it follows that the failure is due to metastability effects in a register receiving a CDC signal.

Once a design error is detected due to failure of a simulation test, it is necessary to understand the nature of the error and correct it. As indicated in step 956, simulation waveforms are generated in human readable form to enable the circuit designer to identify and trace the failure back to the root cause. Thus, the designer is able to readily determine the nature of the design error. Since many registers may be metastable in the simulation of step 954, it may be difficult to determine which CDC signal is the root cause of the problem. To identify the root cause of the problem, the simulation can be re-run with all but a selected set of metastability effects generators removed or disabled, as indicated at step 957. In one embodiment of the invention, each metastability effects generator uses a separate randomizer 924 and a separate seed input 927 so that removing a metastability effects generator will not affect the pseudo-random values used by the other metastability effects generators. By iteratively running simulations with all but selected metastability effects generators removed or disabled, it is possible to identify sections of the circuit that will function unpredictably in hardware due to the effects of metastability. However, when a circuit design is fully tolerant of metastability effects, then every pre-existing simulation test that passed in step 950 should also pass in step 953, even with all metastability effects generators included and enabled. Thus, by iteratively repeating steps 950-957, the circuit designer will be able to identify and correct metastability-related errors in the circuit design and the process flow in FIG. 13 will eventually proceed along the pass path from step 955 to 958.

Figure 14:
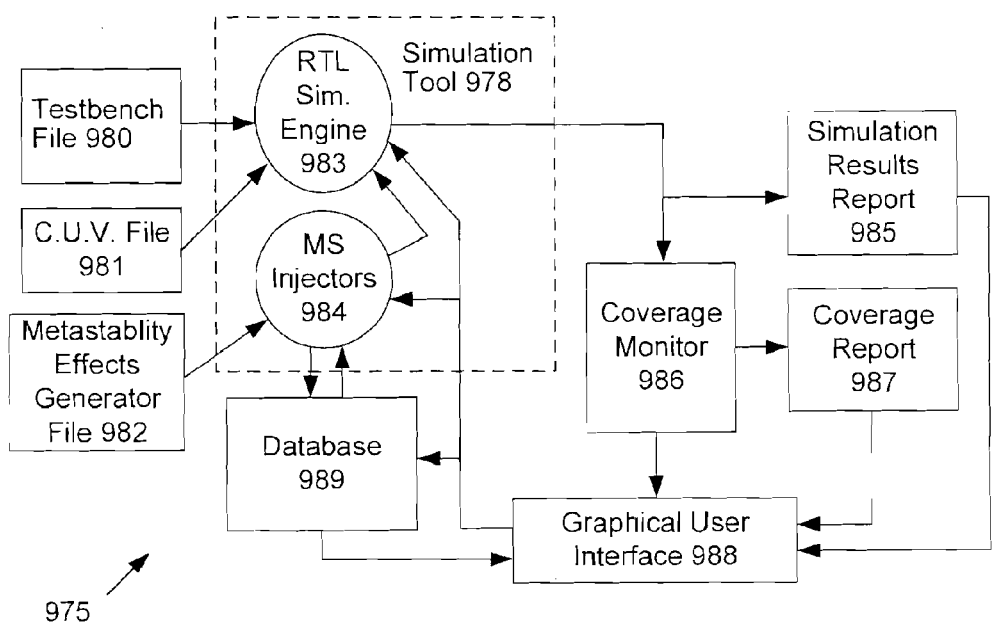
FIG. 14 illustrates a block diagram of a simulation environment in accordance with an embodiment of the present invention.

FIG. 14 illustrates a block diagram of a simulation environment 975 in accordance with the present invention. Simulation environment 975 includes a simulation tool 978. Simulation tool 978 uses as input a testbench file 980, which is a Verilog or VHDL source file that describes stimulus to be applied to a circuit-under-verification (CUV), a CUV file 981, describing the CUV in Verilog or VHDL, and a metastability effects generators file 982. Metastability effects generators file 982 provides metastability effects generators 920 that are associated with nodes of the circuit described by CUV file 981. Metastability effects generators file 982 is a separate file and is not combined with either testbench file 980 or CUV file 981 before it is used as input by simulation tool 978. Instead, metastability effects generators file 982 is accessed by simulation tool 978 and is automatically appended by simulation tool 978 to testbench file 980 and CUV file 981.

While simulation tool 978 simulates operation of the circuit using CUV file 981, metastability injectors 984 monitor simulation engine 983 for "is aligned" and "is changing" conditions. When metastability injector 984 detects appropriate conditions for a particular node, it pseudo-randomly injects or forces metastability onto the node in the simulation of the CUV. In other embodiments, metastability effects are injected at times selected by a predetermined algorithm.

Simulation tool 978 generates a simulation results report 985 showing whether the CUV design functions in the anticipated manner. Report 985 may be written to a file. The circuit designer may study report 985 to verify proper functionality. Also provided is a coverage monitor 986 that collects statistics related to the injections of metastability effects. Coverage monitor 986 generates a coverage report 987 that indicates for each CDC signal, how many times the signal changed at the data input of the receiving register during the critical time when the TCD and RCD clocks were aligned and how many times the associated pseudo-random metastability injector forced inversion of the output of the receiving register. Report 987 may also be written to a file and then combined with report 985 to present a comprehensive analysis of the simulation.

A graphical user interface (GUI) 988 is provided to control simulation tool 978. Specifically, GUI 988 enables a user to control the simulation environment and allows the circuit designer to easily access simulation results report 985 and coverage report 987 either during or after the simulation. The circuit designer may also modify the setup-hold window by selecting one of a plurality of possible window widths including one option that allows the circuit designer to specify any desired window width. Other options include the ability to selectively remove or disable coverage monitors or metastability effects generators based on a review of the simulation results or coverage reports. Further, the circuit designer may designate whether to turn on a debugging feature that generates a message to simulation results report 985 and coverage report 987 that identifies where and when metastability effects are injected.

In one embodiment of the present invention, a metastability effects generator is customized for each TCD-RCD pair. The customization information may be changed during simulation through the GUI by updating a lookup table stored in database 989. Database 989 may be stored in any computer readable medium.

For each metastability effects generator, database 989 also preferably stores the seed value used to configure the randomizer at input 927 (FIG. 10). The seed value is associated with each run of the simulation and may be selected using the GUI at the start of simulation.

Figure 15:
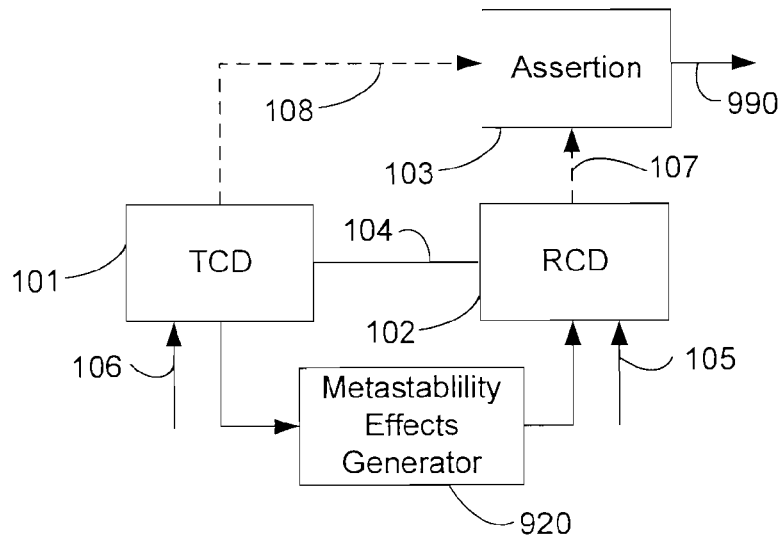
FIG. 15 illustrates a model for the use of assertions with metastability injection for identifying and correcting errors using the simulation environment of FIG. 14 in accordance with an embodiment of the present invention.

Yet another embodiment of the present invention is illustrated in conjunction with FIG. 15. This embodiment shows two portions 101 and 102 of a circuit. A path 104 carries a CDC signal from portion 101 to portion 102. Portion 101 is a TCD and portion 102 is a RCD. Although not illustrated, path 104 may pass through any amount of combinational logic. Registers in one portion 102 are clocked by a clock signal on a path 105 whereas registers in the other portion 101 are clocked by an asynchronous clock signal on a different path 106. The difference in clock signals on paths 105 and 106 can be a difference in only frequency or only phase or both frequency and phase.

FIG. 15 also illustrates an assertion 103 that receives input signals on paths 108 and 107 respectively from each of the two clock domains 101 and 102. Paths 107 and 108 are shown as dashed lines to indicate that the paths are not necessarily present in a circuit description.

The circuit designer may specify one or more assertions to monitor signals in circuit portions 101 and 102. The assertions generate error signals 990 when certain combinations of signals in circuit portions 101 and 102 cause conditions specified in the assertions to be violated during simulation. The combination of assertions and metastability effects injection is a powerful technique to determine whether a circuit design implemented in hardware will function correctly when subjected to the effects of metastability.

The present invention provides substantial advantage to a circuit designer confronted with the need to design a large-scale circuit with multiple clock domains and many CDC signals. Rather than having to wait for hardware embodiments to be tested to determine if the logic design is able to tolerate the effects of metastability, the present invention provides a tool that accurately models the effects of metastability within RTL simulation without requiring modification of pre-existing RTL design files or simulation test files. The simulation with metastability injection is repeatable and will not generate false errors because the metastability effects are injected only when the clocks are aligned within a user definable window and the data input of receiving register is changing.

Although the present invention is illustrated in connection with specific embodiments for instructional purposes, the present invention is not limited thereto. Various adaptations and modifications may be made without departing from the scope of the invention. For example, although model checking is used in some embodiments, other embodiments use other formal verification methods to find a stimulus sequence that violates an assertion as noted above. Various formal verification techniques and simulation mechanisms described herein, although described together, may be used to advantage independently of other techniques and mechanisms, as desired.

For background on the just-described simulation technique, see, for example, the following reference, which is incorporated herein by reference in its entirety: Tai Ly, et al., "A Methodology for Verifying Sequential Reconvergence of Clock-Domain Crossing Signals", DVCon, February, 2005.

Tools for formal verification that may be used in act 620 are available in the prior art (either commercially or from public sources such as universities and laboratories), and may be based on any of a number of techniques, such as (1) symbolic model checking, (2) symbolic simulation, (3) explicit state enumeration, and (4) satisfiability (SAT). For background on each of the just-described techniques, see, for example, the following references, each of which is incorporated by reference herein in its entirety:

(1) an article by J. R. Burch, E. M. Clarke, K. L. McMillan, D. L. Dill, and J. Hwang, entitled "Symbolic model checking: 1020 states and beyond", published in Information and Computation, Vol. 98, no. 2, June 1992; another article entitled "Coverage Estimation for Symbolic Model Checking" by Yatin Hoskote, Timothy Kam, Pei-Hsin Ho, and Xudong Zhao, published in Proceedings of DAC 1999 (Best Paper Award), pp. 300-305, and a PhD thesis by K. L. McMillan entitled "Symbolic model checking—an approach to the state explosion problem", Carnegie Mellon University, 1992;

(2) article entitled "Automatic Verification of Pipelined Microprocessor Control," by Jerry R. Burch and David L. Dill, published in the proceedings of International Conference on Computer-Aided Verification, LNCS 818, Springer-Verlag, June 1994;

(3) article by E. M. Clarke, E. A. Emerson and A. P. Sistla entitled "Automatic verification of finite-state concurrent systems using temporal logic specifications" published in ACM Transactions on Programming Languages and Systems, 8(2): 244-263, 1986; and article entitled "Protocol Verification as a Hardware Design Aid" by David Dill, Andreas Drexler, Alan Hu and C. Han Yang published in Proceedings of the International Conference on Computer Design, October 1992;

(4) article entitled "Bounded Model Checking Using Satisfiability Solving" by Edmund Clarke, Armin Biere, Richard Raimi, and Yunshan Zhu, published in Formal Methods in System Design, volume 19 issue 1, July 2001, by Kluwer Academic Publishers.

In addition, see U.S. Pat. No. 5,465,216 granted to Rotem, et al. on Nov. 7, 1995, and entitled "Automatic Design Verification" (that is incorporated by reference herein in its entirety) for an additional example of formal verification tool. See also U.S. Pat. No. 6,192,505 granted to Beer, et al. on Feb. 20, 2001, and entitled "Method and system for reducing state space variables prior to symbolic model checking" that is incorporated by reference herein in its entirety.

Formal verification tools available in the prior art for property checking include, for example, Symbolic Model Verification (SMV) software package available from Carnegie-Mellon University, and the coordinated specification analysis (COSPAN) software package available from Bell Laboratories (e.g. at ftp "dot" research "dot" att "dot" com wherein the word "dot" is to be replaced by "." to form the ftp address).

For additional information on formal verification tools, see C. Kern and M. R. Greenstreet, "Formal Verification in Hardware Design: A Survey," in ACM Trans. on Design Automation of Electronic Systems, vol. 4, pp. 123-193, April 1999, that is incorporated by reference herein in its entirety.

Note also that some embodiments of the invention may be implemented as described in an article entitled "Formally Verifying Clock Domain Crossing Jitter Using Assertion-Based Verification", Design And Verification Conference, Tai Ly, Neil Hand and Chris Ka-kei Kwok, February 2004 that is incorporated by reference herein in its entirety.

Also, although formal verification is used in some embodiments of act 620, other embodiments may use other methods. For example, one alternative embodiment performs act 620 by simulation (either manually or using a simulator) of each and every possible stimulus (wherein the stimulus sequence is a sequence of vectors, with one vector of inputs for each cycle), for the number of cycles "L" and check if the assertion is violated during the simulation. So, in the example illustrated in FIG. 7, there are four possible inputs for the first cycle (as there are two enable signals for the two metastability injectors and each enable signal can be either asserted or deasserted). There are also four possible inputs for the second cycle. Therefore, if L is 2 in this example, then there are 16 possible sequences of inputs all of which are simulated.

Moreover, according to the method of the invention, an initial state represented in the Verilog can correspond to any state reachable by the circuit under verification during normal operation.

Furthermore, although transmission of a one-hot signal across clock domains, and checking by the pre-determined assertion that the signal in the receive clock domain is in fact one hot has been described above in some embodiments, other embodiments may transmit signals with other properties across clock domains, and check their respective properties conform to the circuit designer's expectations. For example, some embodiments transmit a Gray coded signal for a count across clock domains, and the pre-determined assertion checks to confirm that the signal received in the receive clock domain is in fact Gray coded (e.g. that no more than one bit changes in each successive cycle).

Note that software (including instructions and data structures) for performing acts of the type illustrated in FIGS. 6A-6E, 9, 11-13 may be embedded in computer readable storage media such as disk drives, magnetic tape, CDs (compact discs) and DVDs (digital versatile discs or digital video discs), and/or encoded in transmission media (with or without a carrier wave upon which the signals are modulated) including a communications network, such as the Internet.

A "computer-readable medium" for purposes of embodiments of the present invention may be any medium that can contain, store, communicate, propagate, or transport a program (e.g., a computer program) for use by or in connection with the instruction execution system, apparatus, system or device. The computer-readable medium can be, by way of example only but not by limitation, an electronic, magnetic, optical, electromagnetic, infrared, or semiconductor system, apparatus, system, device, propagation medium, or computer memory.

Reference throughout the specification to "one embodiment," "an embodiment," or "a specific embodiment" means that a particular feature, structure, or characteristic described in connection with the embodiment is included in at least one embodiment of the present invention and not necessarily in all embodiments. Thus, respective appearances of the phrases "in one embodiment," "in an embodiment," or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Further, at least some of the components of an embodiment of the invention may be implemented by using a programmed general-purpose digital computer, by using application specific integrated circuits, programmable logic devices, or field programmable gate arrays, or by using a network of interconnected components and circuits. Connections may be wired, wireless, by modem, and the like.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a," "an," and "the" includes plural references unless the context clearly dictates otherwise. Further, as used in the description herein and throughout the claims that follow, the meaning of "in" includes "in" and "on" unless the context clearly dictates otherwise. Still further, as used in the description herein and throughout the claims that follow, the meaning of inject, injection or force are used interchangeably to refer to forcing a signal on the output of selected registers during the simulation test (for example, by using the Verilog "force" statement).

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

APPENDIX A (PRIOR ART)

```
1
2  module design (tx_clk, rx_clk, rst, rx_q_0, rx_q_1, error);
3  input tx_clk, rx_clk, rst;
4  output rx_q_0, rx_q_1, error;
5
6  wire tx_d_0, tx_d_1, tx_q_0, tx_q_1, rx_d_0, rx_d_1;
7  reg tx_reg_0, tx_reg_1, rx_reg_0, rx_reg_1;
8  reg error;
9
10 assign tx_q_1 = tx_reg_1;
11 assign tx_q_0 = tx_reg_0;
12 assign tx_d_1 = tx_q_0;
13 assign tx_d_0 = tx_q_1;
14
15 initial begin
16   error = 1'b0;
17   tx_reg_1 = 1'b0;
18   tx_reg_0 = 1'b1;
19   rx_reg_1 = 1'b0;
20   rx_reg_0 = 1'b1;
21 end
22
23 always @(posedge tx_clk ) begin
24   if (rst) begin
25     tx_reg_1 = 1'b0;
26     tx_reg_0 = 1'b1;
27   end
28   else begin
29     tx_reg_1 = tx_d_1;
30     tx_reg_0 = tx_d_0;
31   end
32 end
33
34 assign rx_q_1 = rx_reg_1;
35 assign rx_q_0 = rx_reg_0;
36
37 always @(posedge rx_clk) begin
38   rx_reg_1 = rx_d_1;
39   rx_reg_0 = rx_d_0;
40 end
41
42 always @(posedge rx_clk) begin
43   if (rx_q_0 == rx_q_1) error = 1'b1;
44 end
45
46 endmodule
```

APPENDIX B (example in one embodiment of invention)

```
1  module design (tx_clk, rx_clk, rst, rx_q_0, rx_q_1, error,
2                 jitter_control_0, jitter_control_1);
3  input tx_clk, rx_clk, rst;
4  output rx_q_0, rx_q_1, error;
5  input jitter_control_0, jitter_control_1;
6  wire tx_d_0, tx_d_1, tx_q_0, tx_q_1, rx_d_0, rx_d_1;
7  reg tx_reg_0, tx_reg_1, rx_reg_0, rx_reg_1;
8  reg error;
9
10 assign tx_q_1 = tx_reg_1;
11 assign tx_q_0 = tx_reg_0;
12 assign tx_d_1 = tx_q_0;
13 assign tx_d_0 = tx_q_1;
14
15 initial begin
16   error = 1'b0;
17   tx_reg_1 = 1'b0;
18   tx_reg_0 = 1'b1;
19   rx_reg_1 = 1'b0;
20   rx_reg_0 = 1'b1;
21 end
```

APPENDIX B-continued (example in one embodiment of invention)

```
22
23 always @(posedge tx_clk ) begin
24   if (rst) begin
25     tx_reg_1 = 1'b0;
26     tx_reg_0 = 1'b1;
27   end
28   else begin
29     tx_reg_1 = tx_d_1;
30     tx_reg_0 = tx_d_0;
31   end
32 end
33
34 assign rx_q_1 = rx_reg_1;
35 assign rx_q_0 = rx_reg_0;
36 assign rx_d_1 =
37   (jitter_control_1 &&
     (tx_reg_1 !== tx_d_1)) ? !tx_q_1 : tx_q_1;
38 assign rx_d_0 =
39   (jitter_control_0 &&
     (tx_reg_0 !== tx_d_0)) ? !tx_q_0 : tx_q_0;
40
41 always @(posedge rx_clk) begin
42   rx_reg_1 = rx_d_1;
43   rx_reg_0 = rx_d_0;
44 end
45
46 always @(posedge rx_clk) begin
47   if (rx_q_0 == rx_q_1) error = 1'b1;
48 end
49
50 endmodule
```

APPENDIX C (example in one embodiment of invention)

```
1
2  # INV: formula 1 failed --- error=0
3  # INV: calling debugger
4  # INV: a sequence of states starting at an initial state
       leading to a bad state
5
6  --State 0:
7  error:0
8  rx_reg_0:1
9  rx_reg_1:0
10 tx_reg_0:1
11 tx_reg_1:0
12
13 --Goes to state 1:
14 error:0
15 rx_reg_0:0
16 rx_reg_1:0
17 tx_reg_0:0
18 tx_reg_1:1
19 --On input:
20 jitter_control_0:1
21 jitter_control_1:0
22 rst:0
23 tx_clk:1
24 rx_clk:1
25
26 --Goes to state 2:
27 error:0
28 rx_reg_0:0
29 rx_reg_1:0
30 tx_reg_0:0
31 tx_reg_1:1
32 --On input:
33 jitter_control_0:1
34 jitter_control_1:0
35 rst:0
36 tx_clk:0
37 rx_clk:0
```

APPENDIX C-continued (example in one embodiment of invention)

```
38
39   --Goes to state 3:
40   error:1
41   rx_reg_0:0
42   rx_reg_1:1
43   tx_reg_0:1
44   tx_reg_1:0
45   --On input:
46   jitter_control_0:0
47   jitter_control_1:0
48   rst:0
49   tx_clk:1
50   rx_clk:1
51
52   # INV: Summary of invariant pass/fail
53   # INV: formula failed --- error=0
```

What is claimed is:

1. A method for verifying a circuit design, the method comprising:
by a computing device, automatically analyzing a description of the circuit design to identify a clock domain crossing signal between a first node in a first clock domain and a second node in a second clock domain;
by the computing device, automatically generating a description of a metastability effects generator for injecting metastability effects;
performing a simulation test of the description of the circuit design using the description of the metastability effects generator; and
outputting a coverage report regarding a result of the simulation of the description of the circuit design using the metastability effects generator.

2. The method of claim 1, wherein automatically analyzing comprises:
determining a plurality of clock domains by grouping clocks of the circuit design that reside in a single clock domain;
determining nodes in the circuit design that reside in one of the plurality of clock domains; and
determining a clock domain crossing signal where the clock domain crossing signal originates in the first node in the first clock domain and is input into the second node in the second clock domain.

3. The method of claim 2, wherein determining nodes comprises determining nodes that have clocks in a same clock group.

4. The method of claim 1, wherein performing the simulation test comprises performing a first simulation test using the description of the metastability effects generator without injecting metastability effects into the first simulation test.

5. The method of claim 4, further comprising collecting metastability information for the clock domain crossing signal using the metastability effects generator during the first simulation test.

6. The method of claim 4, wherein performing the simulation test comprising performing a second simulation test using the description of the metastabilty effects generator with injection of metastability effects into the second simulation test.

7. The method of claim 6, wherein performing the second simulation comprises using results of the first simulation test to inject the metastability effects into the second simulation test.

8. The method of claim 1, wherein automatically generating comprises:
generating code for the description of the metastability effects generator; and
storing the code in a file.

9. The method of claim 8, wherein the file is separate from the description of the circuit design.

10. A computer-readable storage medium including executable instructions for execution by the one or more computer processors, the executable instructions when executed executable to:
automatically analyze a description of the circuit design to identify a clock domain crossing signal between a first node in a first clock domain and a second node in a second clock domain;
automatically generate a description of a metastability effects generator for injecting metastability effects;
perform a simulation test of the description of the circuit using the description of the metastability effects generator; and
output a coverage report regarding a result of the simulation of the description of the circuit using the metastability effects generator.

11. The computer-readable storage medium of claim 10, wherein executable instructions executable to automatically analyze comprises executable instructions executable:
determine a plurality of clock domains by grouping clocks of the circuit design that reside in a single clock domain;
determine nodes in the circuit design that reside in one of the plurality of clock domains; and
determine a clock domain crossing signal where the clock domain crossing signal originates in the first node in the first clock domain and is input into the second node in the second clock domain.

12. The computer-readable storage medium of claim 11, wherein the executable instructions executable to determine nodes comprises executable instructions executable to determine nodes that have clocks in a same clock group.

13. The computer-readable storage medium of claim 10, wherein the executable instructions executable to perform the simulation test comprises the executable instructions executable to perform a first simulation test using the description of the metastability effects generator without injecting metastability effects into the first simulation test.

14. The computer-readable storage medium of claim 13, the executable instructions is further executable to collect metastability information for the clock domain crossing signal using the description of the metastability effects generator during the first simulation test.

15. The computer-readable storage medium of claim 14, wherein the executable instructions executable to perform the simulation test comprising executable instructions executable to perform a second simulation test using the description of the metastabilty effects generator with injection of metastability effects into the second simulation test.

16. The computer-readable storage medium of claim 15, wherein the executable instructions executable to perform the second simulation comprises executable instructions further executable to use results of the first simulation test to inject the metastability effects into the second simulation test.

17. The computer-readable storage medium of claim 10, wherein the executable instructions executable to automatically generate comprises executable instructions further executable to:
generate code for the description of the metastability effects generator; and
store the code in a file.

18. The computer-readable storage medium of claim 17, wherein the file is separate from the description of the circuit design.

19. An apparatus configured to verify a circuit design, the apparatus comprising:

means for automatically analyzing a description of the circuit design to identify a clock domain crossing signal between a first node in a first clock domain and a second node in a second clock domain;

means for automatically generating a description of a metastability effects generator for injecting metastability effects;

means for performing a simulation test of the description of the circuit using the description of the metastability effects generator; and means for outputting a coverage report regarding a result of the simulation of the description of the circuit using the metastability effects generator.

20. An apparatus configured to verify a circuit design, said circuit design containing a receiving register receiving a clock domain crossing signal on at least one input, the apparatus comprising:

one or more computer processors; and executable instructions encoded in one or more computer readable storage media for execution by the one or more computer processors and when executed executable to:

automatically analyze a description of the circuit design to determine a receiving register receiving a clock domain crossing signal on at least one input;

automatically generate a metastability effects generator for injecting metastability effects Onto an output of said receiving register based on the analysis; and control said metastability effects generator to inject metastability effects during a simulation test.

21. An apparatus configured to verify a design of a circuit under verification, the apparatus comprising:

one or more computer processors; and executable instructions encoded in one or more computer readable storage media for execution by the one or more computer processors and when executed executable to:

transform an original description of the circuit under verification by adding description of circuitry to inject effects of metastability into the circuit under verification, resulting in a transformed description;

analyze the transformed description to determine a stimulus sequence for the transformed description to violate a pre-determined assertion using a clock domain crossing signal that is inverted to inject the effects of metastability by the added description of the circuitry; and output a result of the analysis.

* * * * *